US012727290B2

(12) United States Patent
Wang et al.

(10) Patent No.: US 12,727,290 B2
(45) Date of Patent: Sep. 1, 2026

(54) LIGHT-EMITTING DEVICE HAVING STRUCTURED ELECTRODE PAD, BACKLIGHT UNIT AND DISPLAY APPARATUS HAVING THE SAME

(71) Applicant: EPISTAR CORPORATION, Hsinchu (TW)

(72) Inventors: Hsin-Ying Wang, Hsinchu (TW); Hui-Chun Yeh, Hsinchu (TW); Jhih-Yong Yang, Hsinchu (TW); Chen Ou, Hsinchu (TW); Cheng-Lin Lu, Hsinchu (TW)

(73) Assignee: ENNOSTAR CORPORATION, Hsinchu (TW)

( * ) Notice: Subject to any disclaimer, the term of this patent is extended or adjusted under 35 U.S.C. 154(b) by 431 days.

(21) Appl. No.: 18/241,471

(22) Filed: Sep. 1, 2023

(65) Prior Publication Data

US 2024/0113262 A1 Apr. 4, 2024

Related U.S. Application Data

(60) Provisional application No. 63/412,096, filed on Sep. 30, 2022.

(51) Int. Cl.

| | |
|---|---|
| ***H10H 20/831*** | (2025.01) |
| ***H10H 20/816*** | (2025.01) |
| ***H10H 20/857*** | (2025.01) |
| ***H10W 90/00*** | (2026.01) |

(52) U.S. Cl.
CPC .... *H10H 20/8312* (2025.01); *H10H 20/8162* (2025.01); *H10H 20/857* (2025.01); *H10W 90/00* (2026.01)

(58) Field of Classification Search
None
See application file for complete search history.

(56) References Cited

U.S. PATENT DOCUMENTS

| | | | | |
|---|---|---|---|---|
| 2017/0108173 | A1* | 4/2017 | Kim | H10H 20/831 |
| 2018/0212123 | A1* | 7/2018 | Chang | H10H 20/857 |
| 2019/0214514 | A1* | 7/2019 | Hong | H10H 20/857 |
| 2020/0243598 | A1* | 7/2020 | Chiu | H10H 20/819 |
| 2021/0098649 | A1* | 4/2021 | Park | H10H 20/857 |
| 2021/0305456 | A1* | 9/2021 | Chen | H10H 20/831 |
| 2022/0278252 | A1* | 9/2022 | Chang | H10H 20/856 |
| 2023/0037469 | A1* | 2/2023 | Check | H10H 20/835 |
| 2023/0077761 | A1* | 3/2023 | Chang | H10H 20/8162 257/98 |

* cited by examiner

*Primary Examiner* — Nilufa Rahim
(74) *Attorney, Agent, or Firm* — DITTHAVONG, STEINER & MLOTKOWSKI

(57) ABSTRACT

A light-emitting device includes a substrate, a semiconductor stack formed on the substrate, a conductive structure, first and second contact electrodes, an insulating stack, and first and second electrode pads. The second electrode pad is disposed in an opening of the insulating stack and connected to the second contact electrode. An upper surface of the second electrode pad includes a platform area and a depression area, wherein a ratio of a projected area A1 of the platform area to to a sum A2 of projected areas of the platform area and the depression area ranges ranges from 50%-80%.

17 Claims, 18 Drawing Sheets

LIGHT-EMITTING DEVICE HAVING STRUCTURED ELECTRODE PAD, BACKLIGHT UNIT AND DISPLAY APPARATUS HAVING THE SAME

CROSS-REFERENCE TO RELATED APPLICATIONS

This application claims priority to and the benefit of U.S. provisional application No. 63/412,096 filed on Sep. 30, 2022, and the content of which is incorporated by reference in its entirety.

BACKGROUND

Technical Field

The present application relates to a light-emitting device having an insulating stack, a backlight unit and a display apparatus having the same.

Description of the Related Art

Light-emitting diodes of solid-state lighting device have the characteristics of low power consumption, low heat-generation, long lifetime, compact size, high response speed and stable emission wavelength. Thus, light-emitting diodes have been widely used in household appliances, indicator lights and optoelectronic products.

Conventional light-emitting diode includes a substrate, an n-type semiconductor layer, an active layer and a p-type semiconductor layer formed on the substrate, and a p-electrode and an n-electrode formed on the p-type and the n-type semiconductor layers, respectively. When light-emitting diode is conducted through the electrode and operates under a specific forward bias, holes from the p-type semiconductor layer and electrons from the n-type semiconductor layer combine in the active layer to emit light. While the light-emitting diodes are incorporated into various optoelectronic products whose volumes are getting smaller, a smaller size of the light-emitting diode with qualified photoelectric characteristics and manufacturing yield is also desired.

SUMMARY OF THE DISCLOSURE

A light-emitting device includes: a semiconductor stack, including a first semiconductor layer, an active region and a second semiconductor layer; a first contact electrode and a second contact electrode formed on the semiconductor stack, wherein the first contact electrode includes a first contact part formed on the first semiconductor layer and the second contact electrode includes a second contact part formed on the second semiconductor layer; an insulating stack formed on the semiconductor stack, including an opening on the second contact part; a first electrode pad and a second electrode pad formed on the insulating stack, wherein the second electrode pad filled in the opening and connecting the second contact part; wherein the second electrode pad includes an upper surface, and the upper surface includes a platform area and a depression area on the second contact part; wherein the platform area has a maximum height relative to other areas of the upper surface; wherein an area of a projection of the platform area on a horizontal plane is A1, and a sum of areas of the projections of the platform area and the depression area on the horizontal plane is A2, and a ratio of A1/A2 ranges from 50%-80%.

DETAILED DESCRIPTION

In order to make the description of the present application more detailed and complete, please refer to the description of the following embodiments and cooperate with the relevant illustrations. However, the examples shown below are used to illustrate the light-emitting device of the present application, and the present application is not limited to the following embodiments. In addition, the dimensions, materials, shapes, relative arrangements, etc. of the elements described in the embodiments in this specification are not limited to the description, and the scope of the present application is not limited to these, but is merely a description. In addition, the size or positional relationship of the elements shown in each figure is exaggerated for clear description. Furthermore, in the following description, in order to appropriately omit detailed descriptions, elements of the same or similar nature are shown with the same names and symbols.

Figure 1A:
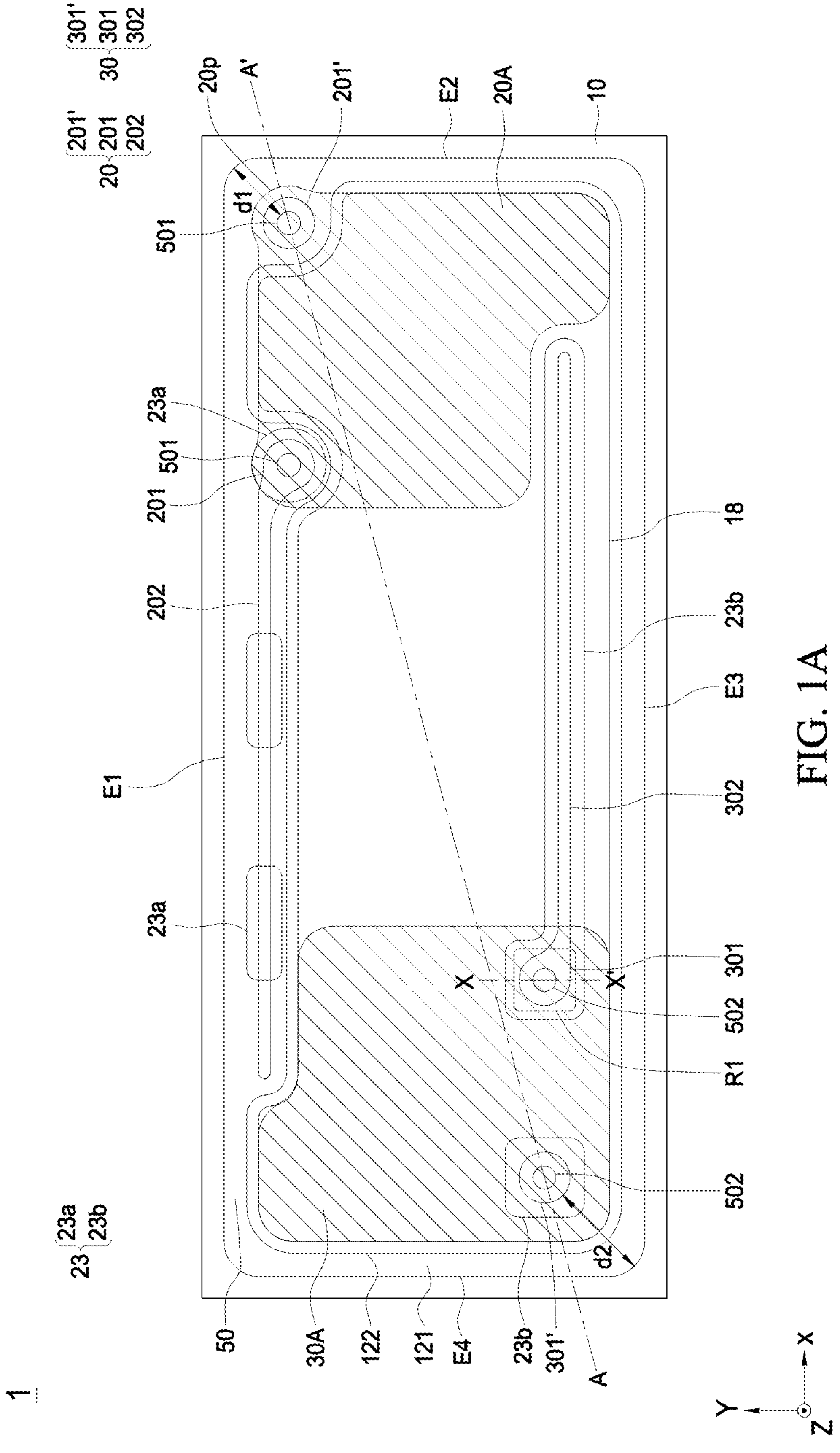
FIG. 1A shows a top view of a light-emitting device in accordance with an embodiment of the present application.
Figure 1B:
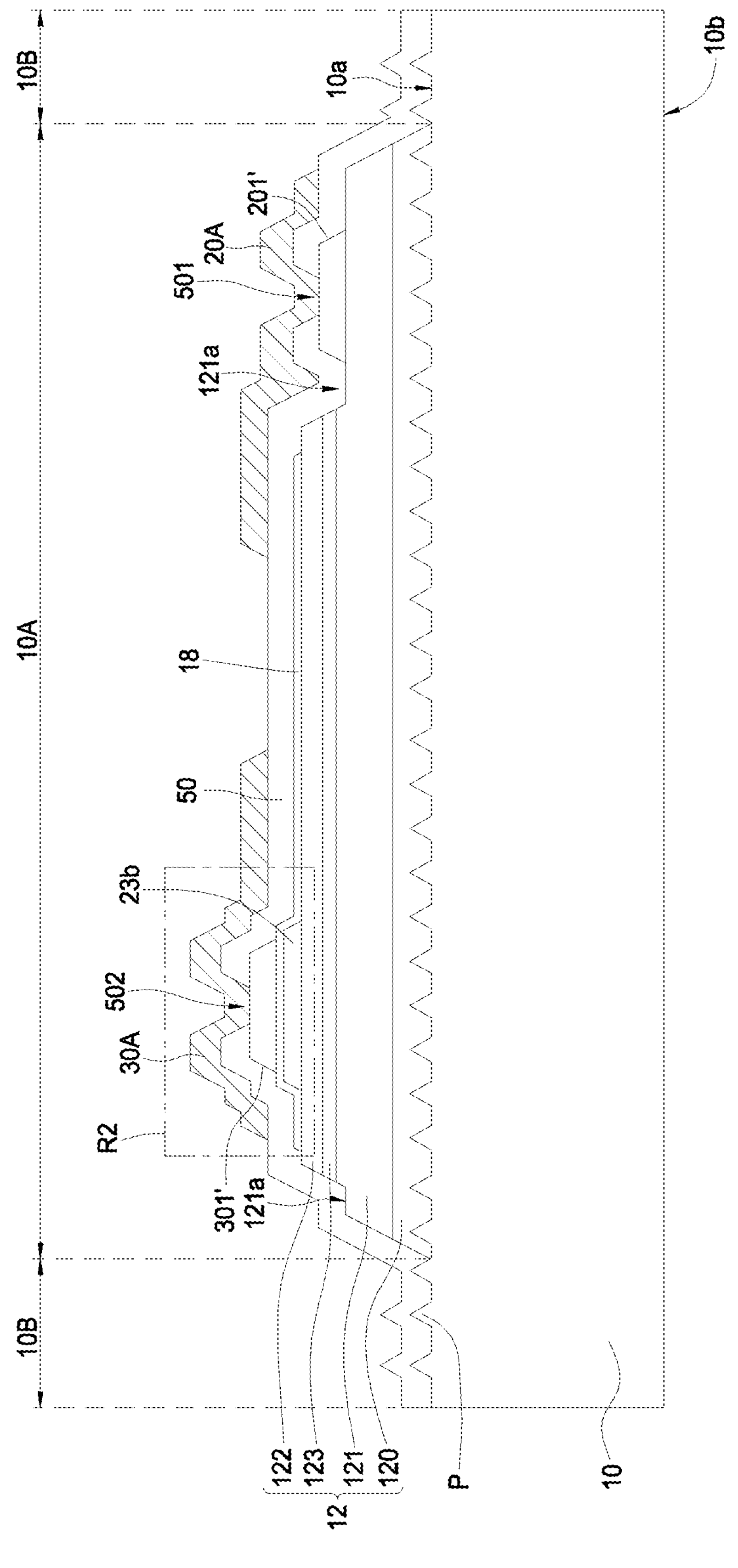
FIG. 1B shows a cross-sectional view taken along A-A' line in FIG. 1A.

FIG. 1A shows a top view of a light-emitting device 1 in accordance with an embodiment of the present application. FIG. 1B shows a cross-sectional view taken along an A-A' line in FIG. 1A.

As shown in FIG. 1A and FIG. 1B, the light-emitting device 1 includes a substrate 10 and a semiconductor stack 12 formed on an upper surface 10*a* of the substrate 10, wherein the semiconductor stack 12 includes a first semiconductor layer 121, an active region 123 and a second semiconductor layer 122. The first semiconductor layer 121 includes an upper surface 121*a* that is not covered by the active region 123 and the second semiconductor layer 122. In a top view, the semiconductor stack 12 includes a first edge E1 and a third edge E3 opposite to each other, and a second edge E2 and a fourth edge E4 opposite to each other. A first contact electrode 20 is formed on the upper surface 121*a* of the first semiconductor layer 121 and electrically connected to the first semiconductor layer 121. A transparent conductive layer 18 and a second contact electrode 30 are formed on and electrically connected to the second semiconductor layer 122. An insulating stack 50 covers the semiconductor stack 12 and the transparent conductive layer 18 and includes openings 501 and 502 exposing the first contact electrode 20 and the second contact electrode 30, respectively. A first electrode pad 20A is formed on the insulating stack 50 and fills the opening 501 to connect the first contact electrode 20. A second electrode pad 30A is located on the insulating stack 50 and fills the opening 502 to connect the second contact electrode 30.

The substrate 10 can be a growth substrate. The substrate 10 includes GaAs or GaP for growing AlGaInP based semiconductor thereon. The substrate 10 includes $Al_2O_3$, GaN, SiC or MN for growing InGaN based or AlGaN based semiconductor thereon. The substrate 10 includes the upper surface 10*a*. In one embodiment, the substrate 10 can be a patterned substrate; that is, the substrate 10 includes patterned structures P on the upper surface 10*a*. In one embodiment, the light generated from the semiconductor stack 12 is refracted, reflected or scattered by the patterned structures P, thereby increasing the brightness of the light-emitting device. In addition, the patterned structures lessen or suppress the dislocation caused by lattice mismatch between the substrate 10 and the semiconductor stack 12, thereby improving the epitaxy quality of the semiconductor stack 12.

In another embodiment, the patterned structures P and the substrate 10 include different materials, and the patterned structure P includes, for example, insulating material, such as silicon oxide, silicon nitride, or silicon oxynitride. In one embodiment, the substrate 10 includes an area 10A without the patterned structures P formed thereon and not covered by the semiconductor stack 12 and an area 10B having the patterned structure P formed thereon and covered by the semiconductor stack 12. In another embodiment, the patterned structures P in the area 10A of the substrate 10 not covered by the semiconductor stack 12 and the patterned structures P in the area 10B of the substrate 10 covered by the semiconductor stack 12 have different sizes, shapes or heights. For example, the patterned structure P in the area 10A not covered by the semiconductor stack 12 has a smaller size and smaller height than the patterned structure P in the area 10B covered by the semiconductor stack 12.

In an embodiment of the present application, the semiconductor stack 12 is formed on the substrate 10 by metal-organic chemical vapor deposition (MOCVD), molecular beam epitaxy (MBE), hydride vapor epitaxy (HVPE) or ion plating such as sputtering or evaporating.

In one embodiment, the semiconductor stack 12 further includes a buffer structure 120 between the first semiconductor layer 121 and the substrate 10. The buffer structure 120 reduces the lattice mismatch and suppresses dislocation so as to improve the epitaxy quality. The material of the buffer structure includes GaN, AlGaN, or MN. In an embodiment, the buffer structure 120 includes a plurality of sub-layers (not shown) and the sub-layers include the same materials or different materials. In one embodiment, the buffer structure 120 includes two sub-layers formed by different methods. For example, a first sub-layer of the buffer structure 120 is grown by sputtering and a second sub-layer of the buffer structure 120 is grown by MOCVD. In another embodiment, the buffer structure 120 further includes a third sub-layer. The third sub-layer is grown by MOCVD, and the growth temperature of the second sub-layer is different from the growth temperature of the third sub-layer. In an embodiment, the first, second, and third sub-layers include the same material, such as MN. In one embodiment, the first semiconductor layer 121 and the second semiconductor layer 122 are, for example, cladding layers or confinement layers. The first semiconductor layer 121 and the second semiconductor layer 122 have different conductivity types, different electrical properties, different polarities or different dopants for providing electrons or holes. For example, the first semiconductor layer 121 is composed of n-type semiconductor and the second semiconductor layer 122 is composed of p-type semiconductor. The active region 123 is formed between the first semiconductor layer 121 and the second semiconductor layer 122. When being driven by a current, electrons and holes are combined in the active region 123 to convert electrical energy into optical energy for illumination. The wavelength of the light generated by the light-emitting device 1 or by the semiconductor stack 12 can be adjusted by changing the physical properties and chemical composition of one or more layers in the semiconductor stack 12.

Figure 1C:
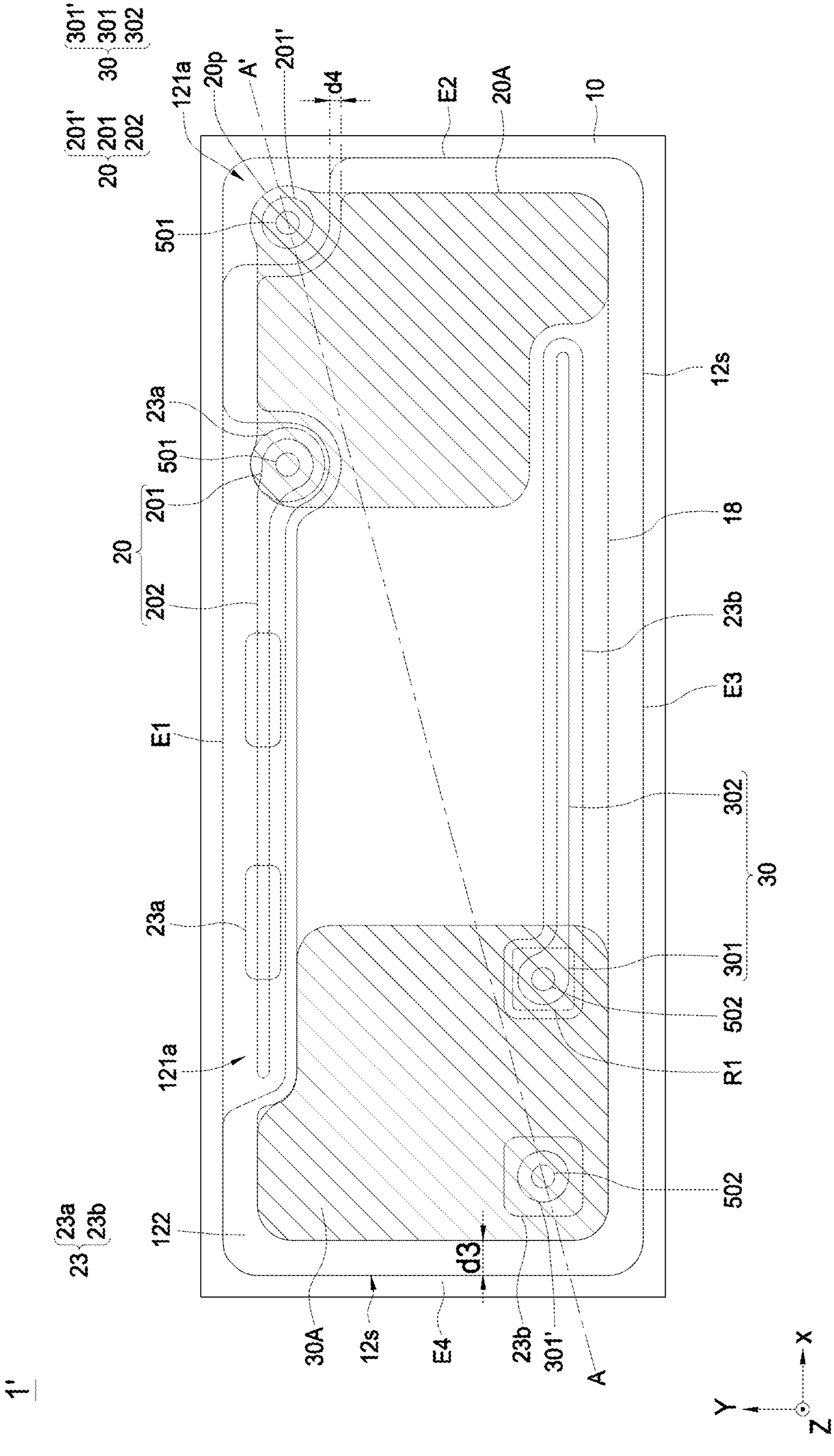
FIG. 1C shows a top view of a light-emitting device in accordance with another embodiment of the present application.
Figure 1D:
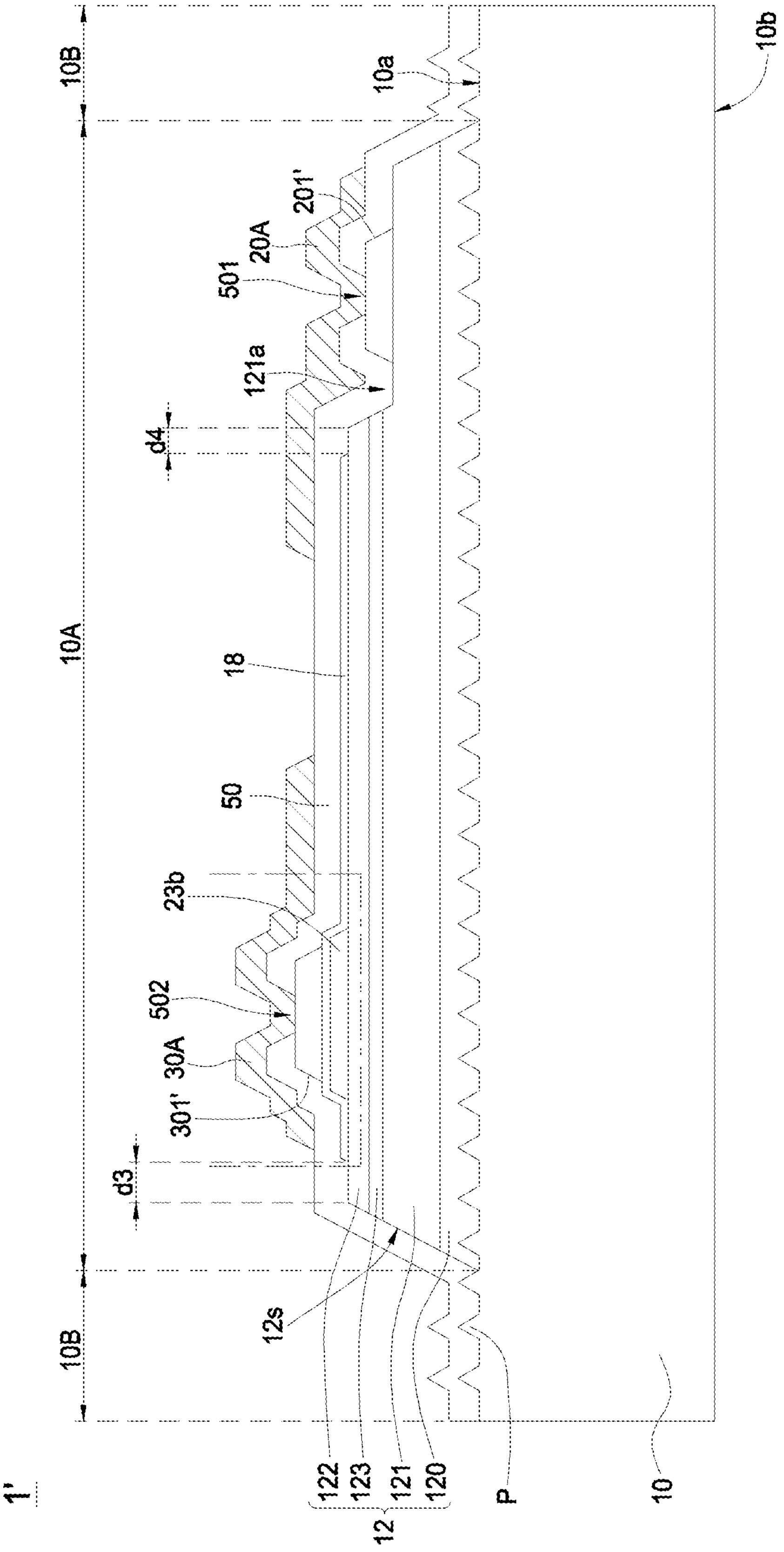
FIG. 1D shows a cross-sectional view taken along A-A' line in FIG. 1C.

The material of the semiconductor stack 12 includes III-V compound semiconductor such as $Al_xIn_yGa_{(1-x-y)}$ N (i.e. AlInGaN base) or $Al_xIn_yGa_{(1-x-y)}P$ (i.e. AlInGaP base), where $0 \leq x, y \leq 1$; $x+y \leq 1$. When the material of the semiconductor stack 12 includes AlInGaP based material, the semiconductor stack 12 emits red light having a wavelength between 610 nm and 650 nm or yellow light having a wavelength between 550 nm and 570 nm. When the material of the semiconductor stack 12 includes AlInGaN based material, the semiconductor stack 12 emits blue light or deep blue light having a wavelength between 400 nm and 490 nm, green light having a wavelength between 490 nm and 550 nm or UV light having a wavelength between 250 nm and 400 nm. The active region 123 can be a single hetero-structure (SH), a double hetero-structure (DH), a double-side double hetero-structure (DDH), or a multi-quantum well (MQW) structure. The material of the active region 123 can be i-type, p-type or n-type semiconductor. In the present embodiment, the upper surface 121*a* of the first semiconductor layer 121 includes a contact area for forming the first contact electrode 20 thereon and a surrounding platform located on the periphery of the semiconductor stack 12 and surrounds the active region 123 and the second semiconductor layer 122. FIG. 1C and FIG. 1D show a light-emitting device 1' in accordance with another embodiment. The light-emitting device 1' is similar to the light-emitting device 1, a difference therebetween is the upper surface 121*a* of the first semiconductor layer 121 of the light-emitting device 1' includes the contact area where the first contact electrode 20 is disposed on, but does not include the surrounding platform. As shown in FIG. 1D, the semiconductor stack 12 includes a sidewall 12*s* extending downward from the second semiconductor layer 122 to the first semiconductor layer 121, so that the sidewall 12*s* has a continuous slope. In one embodiment, the semiconductor stack 12 can be etched from the top surface of the second semiconductor layer 122 down to the upper surface 10*a* of the substrate 10 to form the sidewall 12*s*. In another embodiment, the etching can be performed in various processes. Firstly, the semiconductor stack 12 can be etched from the top surface of the second semiconductor layer 122 until the upper surface 121*a* of the first semiconductor layer 121 is formed, and then, the semiconductor stack 12 is partially etched from the upper surface 121*a* of the first semiconductor layer 121 down to the upper surface 10*a* of the substrate 10, to form the sidewall 12*s* and part of the upper surface 121*a* is remained to be the contact area where the first contact electrode 20 is disposed on. In addition, the gap between the edge of the transparent conductive layer 18 and the edge of the second semiconductor layer 122 is not constant. In some regions where the transparent conductive layer 18 adjacent to the sidewall 12*s*, the gap between the edge of the transparent conductive layer 18 and the edge of the second semiconductor layer 122 can be widened. For example, the gap which is near the upper surface 121*a* of the first semiconductor 121 is smaller than the gap in other regions. That is, as shown in FIGS. 1C and 1D, a gap d3 is greater than a gap d4. In some cases, due to process variations during the formation of the sidewall 12*s*, the semiconductor stack 12 may be over-etched and the edge of the transparent conductive layer 18 may exceed or touch the edge of the second semiconductor layer 122. In the present embodiment, the situation can be prevented so the process tolerance can be broadened.

The first contact electrode 20 includes a plurality of first contact parts 201, 201' and a first finger part 202, wherein in the top view, the plurality of first contact parts 201, 201' are separated from each other and have dot shapes. The first finger part 202 has a strip shape, and a width of the first finger part 202 is smaller than that of the first contact part 201. As shown in FIG. 1A, in the top view, a plurality of first contact parts 201, 201' and the first finger part 202 are arranged along the first edge E1, and the first contact part 201 is connected to the first finger part 202. The first contact part 201' is located at a corner where the first edge E1 intersects the second edge E2. The second contact electrode 30 includes a plurality of second contact parts 301, 301' and a second finger part 302. In the top view, the plurality of second contact parts 301, 301' are separated from each other and have dot shapes. The second finger part 302 has a stripe shape, and a width of the second finger part 302 is smaller than that of the second contact part 301. As shown in FIG. 1A, in the top view, the plurality of second contact parts 301, 301' and the second finger part 302 are arranged along the third edge E3, and the second contact part 301 is connected to the second finger part 302. The second contact part 201' is located at a corner where the third edge E3 intersects the fourth edge E4. In one embodiment, the minimum distance d1 between the opening 501 on the first contact part 201' and the corner where the first contact part 201' is located is smaller than the minimum distance d2 between the opening 502 on the second contact part 301' and the corner where the second contact part 301' is located. The first contact part 201' and the second contact part 301' are disposed opposite to each other in a diagonal direction or approximately a diagonal direction of the light-emitting device 1.

Figure 1E:
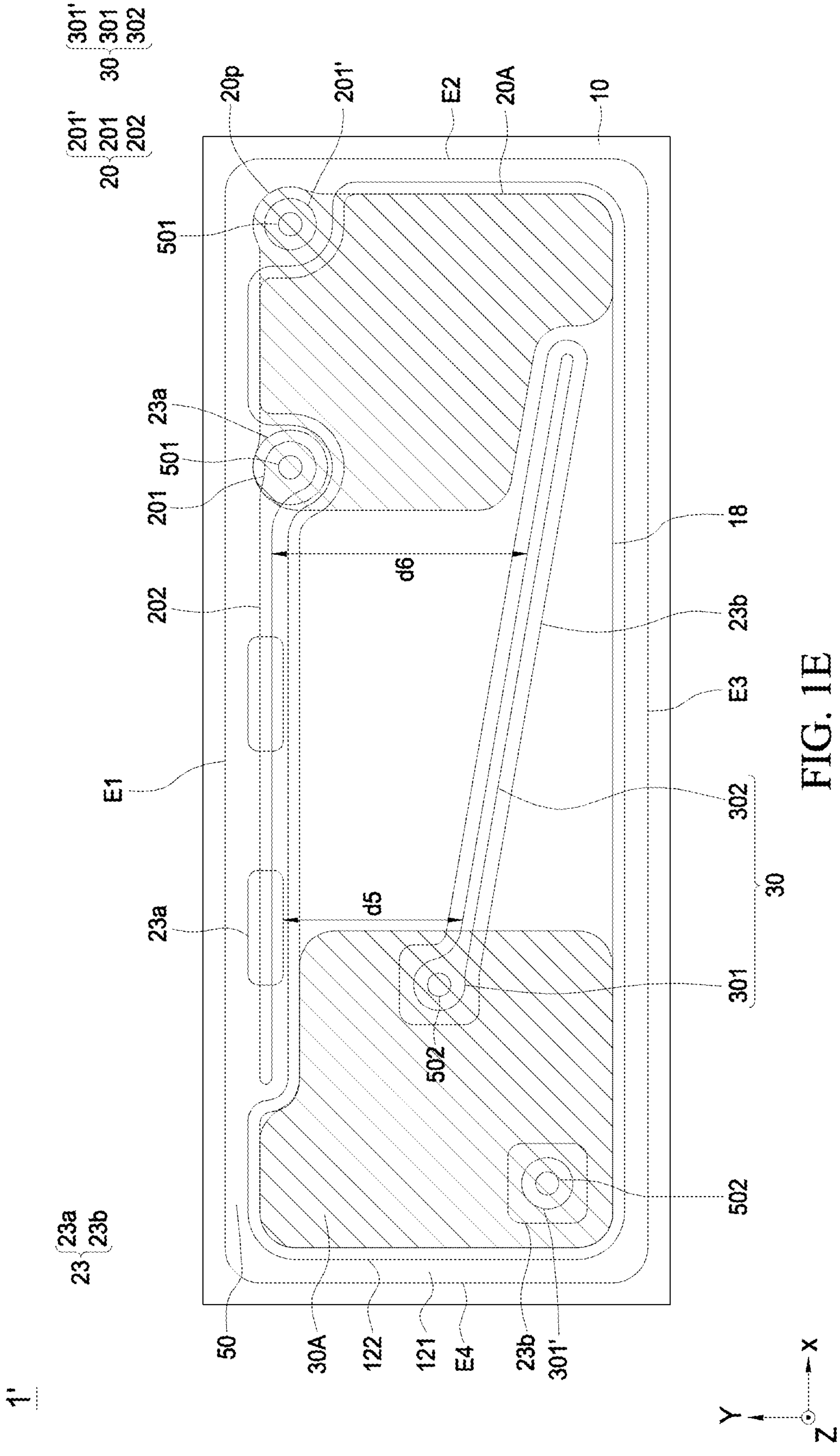
FIG. 1E shows a top view of a light-emitting device in accordance with another embodiment of the present application.

The first finger part 202 and the second finger part 302 extend along the longitudinal direction (X direction) of the light-emitting device 1 and are parallel to each other. The first finger part 202 extends along the first edge E1, and the second finger part 302 extends along the third edge E3. The maximum distance between the first finger part 202 and the second finger part 302 is greater than 0.75 times the length of the second edge E2 or the fourth edge E4, and the length of the first finger part 202 and/or the second finger part 302 is greater than 0.5 times the length of the first edge E1 or the third edge E3. The minimum distance between the first finger part 202 and the first edge E1 is smaller than the minimum distance between the second finger part 302 and the third edge E3. In another embodiment (not shown), the first finger part 202 and the second finger part 302 are not parallel with each other, for example, the first finger part 202 and/or the second finger part 302 includes an arc or a bend. FIG. 1E shows a light-emitting device 1" in accordance with another embodiment. The light-emitting device 1" is similar to the light-emitting device 1 or the light-emitting device 1', and a difference therebetween is the second finger part 302 of the light-emitting device 1" is not parallel with the first finger part 202. A distance between the second finger part 302 and the first finger part 202 increases as the second finger part 302 extends away from the second contact part 301. For example, the distance d6 is greater than the distance d5. In another embodiment (not shown in the figure), the light-emitting device 1" does not include the first finger part 202, and the distance between the second finger part 302 and the first edge E1 increases as the second finger part 302 extends away from the second contact par 301. In some cases, when current is injected from the first electrode pad 20A into the first contact parts 201 and 201', the current may crowd easily in a region near the first contact parts so the current density may be higher. In the present embodiment, an end of the second finger part 302 is kept away from the first contact part 201. As a result, the current distribution can be uniform and the light efficiency of the light-emitting device is improved. In one embodiment, the distance between the first contact parts 201 and 201' is greater than the distance between the second contact parts 301 and 301'. As shown in FIG. 1A, an overlapping length of the first finger part 202 and the second finger part 302 in the longitudinal direction (X direction) is greater than the distance between the first contact parts 201' and 201, and can also be greater than the distance between the second contact parts 301' and 301. In this way, current spreading and current uniformity can be improved. In one embodiment, in the top view, the contour of the first electrode pad 20A includes a protruding portion 20*p* protruding toward the corner of the light-emitting device 1 to completely cover the first contact part 201' located at the corner. More specifically, the protruding portion 20*p* is at least 1 μm beyond the edge of the first contact part 201'. In this way, reliability of the first electrode pad 20A can be improved and it can be ensured that the first electrode pad 20A contacts the first contact part 201' through the opening 501.

The material of the first contact electrode 20 and the second contact electrode 30 include metal such as Cr, Ti, W, Au, Al, Rh, In, Sn, Ni, Pt, Ag and other metals, or a laminated stack or an alloy of the above materials. Each of the first contact electrode 20 and the second contact electrode 30 includes an inclined sidewall. In one embodiment, the thickness of the first contact electrode 20 and the second contact electrode 30 is between 0.3-3 μm.

A current blocking structure 23 is formed on the semiconductor stack 12 and can block current from directly injecting into the semiconductor stack right below the contact electrodes, thereby increasing lateral current spreading. The material of the current blocking structure 23 includes insulating materials, such as silicon oxide, silicon nitride, silicon oxynitride, niobium oxide, hafnium oxide, titanium oxide, magnesium fluoride, aluminum oxide, and the like. The current blocking structure 23 includes a first insulating portion 23*a* located between the first semiconductor layer 121 and the first contact electrode 20, and a second insulating portion 23*b* located between the second semiconductor layer 122 and the second contact electrode 30 and extending along the second finger part 302 of the second contact electrode 30. The current blocking structure 23 includes inclined sidewalls. In a top view, the width of the current blocking structure 23 is larger than the width of the contact electrode right above it. In one embodiment, the second insulating portion 23*b* has a shape that is the same as that of the second contact electrode 30. In another embodiment, the light-emitting device 1 can only have the second insulating portion 23*b* disposed on the second semiconductor layer 122, or can have no any current blocking structure 23. In one embodiment, the first insulating portion 23*a* includes a plurality of islands separated from each other, wherein one of the plurality of islands is located below the first contact portion 201, and the others of the plurality of islands is spaced apart and arranged along the first finger part 202. In one embodiment, the first contact electrode 20 includes a plurality of first contact parts 201, 201', wherein the first insulating portion 23*a* is disposed under the first contact part 201, and no current blocking structure is provided under the first contact part 201'. Therefore, the first contact part 201' is directly connected to the first semiconductor layer 121.

As shown in FIGS. 1A and 1B, the transparent conductive layer 18 is formed under the second contact electrode 30 and covers the second semiconductor layer 122 and the second insulating portion 23*b*. The transparent conductive layer 18 can spread current and provide good electrical contact with the second semiconductor layer 122, such as ohmic contact. The transparent conductive layer 18 is transparent to the light emitted from the active region 123. For example, the transparent conductive layer 18 has a transmittance of more than 80% to the light emitted from the active region 123. The material of the transparent conductive layer 18 can be a metal or a transparent conductive material. The metal material includes Au, NiAu, etc. The transparent conductive material includes graphene, ITO, AZO, GZO, ZnO, IZO and other materials. In another embodiment (not shown), the light-emitting device 1 does not include current blocking structure, and the transparent conductive layer 18 includes a plurality of openings disposed right under the second finger part 302, so that the second finger part 302 contacts the second semiconductor layer 122 through the plurality of openings of the transparent conductive layer 18.

As shown in FIG. 1B, the insulating stack 50 covers the semiconductor stack 12, the transparent conductive layer 18, the first contact electrode 20 and the second contact electrode 30. The openings 501 of the insulating stack 50 expose the first contact parts 201 and 201', and the openings 502 expose the second contact parts 301 and 301'. The insulating stack 50 extends from the sidewalls of the semiconductor stack 12 to cover the upper surface 10*a* of the substrate 10. In another embodiment (not shown), the insulating stack 50 does not cover a part of the upper surface 10*a*, specifically, the insulating stack 50 does not cover the periphery of the upper surface 10*a*.

Figure 2A:
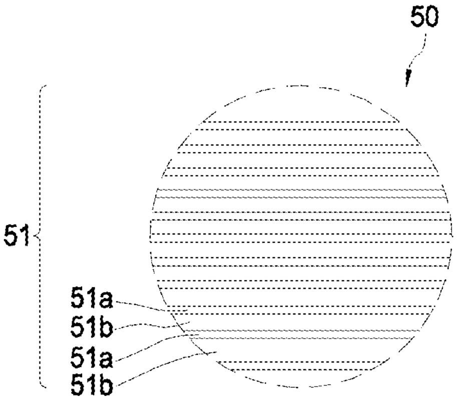
FIGS. 2A and 2B show cross-sectional views of an insulating stack in accordance with different embodiments of the present application.
Figure 2B:
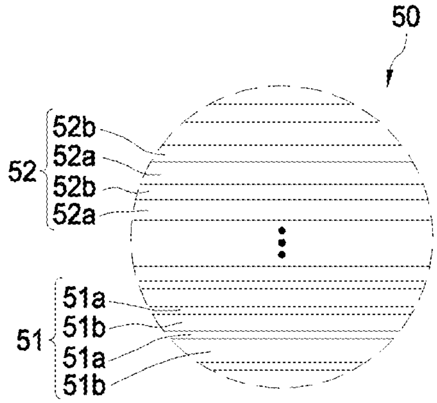

FIGS. 2A and 2B show the detailed structure of the insulating stack 50 in different embodiments. The insulating stack 50 can reflect light within a specific wavelength range and/or a specific incident angle range, that is, the insulating stack 50 can be a reflective structure. For example, the insulating stack 50 has a reflectance of more than 60% of the dominant wavelength and/or the peak wavelength of the light-emitting device 1. In one embodiment shown in FIG. 2A, the insulating stack 50 includes a first stack 51. The first stack 51 includes one or more pairs of insulating layers and one pair of the insulating layers is composed by a first sub-layer 51*a* and a second sub-layer 51*b*. The first stack 51 includes insulating material. The first sub-layer 51*a* has a refractive index higher than that of the second sub-layer 51*b*. By selecting materials with different refractive index and the thicknesses thereof, the insulating stack 50 can reflect lights within a pre-defined wavelength range. In one embodiment, the first sub-layer 51*a* has a smaller thickness than the second sub-layer 51*b*. The first sub-layer 51*a* and the second sub-layer 51*b* include insulating material such as silicon oxide, silicon nitride, silicon oxynitride, niobium oxide, hafnium oxide, titanium oxide, magnesium fluoride, aluminum oxide, etc. In one embodiment, the insulating stack 50 includes distributed Bragg reflector.

In another embodiment, the insulating stack 50 further includes additional layers other than the first sub-layer 51*a* and the second sub-layer 51*b*. For example, the insulating stack 50 further includes a bottom layer (not shown) between the first stack 51 and the semiconductor stack 12. In other words, the bottom layer is formed on the semiconductor stack 12 first, and then the first sub-layers 51*a* and the second sub-layers 51*b* are formed on the bottom layer. In one embodiment, the bottom layer includes insulating material and the thickness thereof is greater than those of the first sub-layer 51*a* and the second sub-layer 51*b*. In one embodiment, the bottom layer can be formed by a process same as that for forming the first sub-layer 51*a* and the second sub-layer 51*b*. For example, the bottom layer, the first sub-layers 51*a* and the second sub-layers 51*b* are formed by chemical vapor deposition (CVD) or physical vapor deposition (PVD). For example, the bottom layer, the first sub-layers 51*a* and the second sub-layers 51*b* are formed by PVD, such as evaporation, sputtering, or the combination thereof, to get a smoother surface of the insulating stack 50. In another embodiment, the bottom layer can be formed by a process different from that for forming the first sub-layer 51*a* and the second sub-layer 51*b*. For example, the bottom layer is formed by CVD, and preferably, formed by plasma enhanced chemical vapor deposition (PECVD). The first sub-layers 51*a* and the second sub-layers 51*b* are formed by PVD, such as evaporation or sputtering. In one embodiment, the bottom layer can protect the light-emitting device or the semiconductor stack. For example, the bottom layer prevents moisture from penetrating the light-emitting device.

In another embodiment shown in FIG. 2B, the insulating stack 50 includes a plurality of stacks. For example, the insulating stack 50 includes the first stack 51 and a second stack 52. The first stack 51 is as described in the above embodiment. The second stack 52 includes one or more pairs of insulating layers and one pair of insulating layers is composed by a third sub-layer 52*a* and a fourth sub-layer 52*b*. The second stack 52 includes insulating material. The third sub-layer 52*a* has a refractive index higher than that of the fourth sub-layer 52*b*. In one embodiment, the third sub-layer 52*a* has a smaller thickness than that of the fourth sub-layer 52*b*. The third sub-layer 52*a* and the first sub-layer 51*a* have different thicknesses, and the third sub-layer 52*a* and the first sub-layer 51*a* can be the same material or different materials. The fourth sub-layer 52*b* and the second sub-layer 51*b* have different thicknesses, and the fourth sub-layer 52*b* and the second sub-layer 51*b* can be the same material or different materials.

In another embodiment, the insulating stack 50 further includes a top layer (not shown) on the first stack 51. In other words, the first sub-layers 51*a* and the second sub-layers 51*b* are formed on the semiconductor stack 12 first, and then the top layer is formed. The thickness of the top layer is greater than the thicknesses of the first sub-layer 51*a* and the second sub-layer 51*b*. In one embodiment, the top layer can be formed by a process different from that for forming the first sub-layer 51*a* and the second sub-layer 51*b*. For example, the top layer is formed by chemical vapor deposition (CVD), and preferably, formed by plasma enhanced chemical vapor deposition (PECVD). The first sub-layers 51*a* and the second sub-layers 51*b* are formed by sputtering or evaporating. In one embodiment, the top layer can improve the robustness of the insulating stack 50. For example, when the insulating stack 50 is subject to an external force, the top layer can prevent the insulating stack 50 from being broken and damaged due to the external force.

In another embodiment, the insulating stack 50 includes the plurality of stacks, the bottom layer and/or the top layer. The thickness of the insulating stack 50 is between 0.5-6 μm. In one embodiment, between 1.5-5.5 μm. In one embodiment, the thickness of the insulating stack 50 is greater than the thickness of the first contact electrode 20 and the second contact electrode 30.

In another embodiment, before forming the insulating stack 50, a dense layer (not shown) is formed on the surface of the transparent conductive layer 18 and the semiconductor stack 20 by atomic layer deposition (ALD) to directly cover the semiconductor stack 12. The material of the dense layer includes silicon oxide, aluminum oxide, hafnium oxide, tantalum oxide, zirconium oxide, yttrium oxide, lanthanum oxide, silicon nitride, aluminum nitride, or silicon oxynitride. In the present embodiment, the interface between the dense layer and the semiconductor stack 12 includes metal elements and oxygen, where the metal elements include aluminum, hafnium, tantalum, zirconium, yttrium, or lanthanum. The dense layer has a thickness between 50 Å and 2000 Å. In one embodiment, between 100 Å and 1500 Å. In one embodiment, the dense layer can be conformably formed on the semiconductor stack 12. Due to the characteristic of good step coverage of the dense layer, the dense layer can protect the semiconductor stack 12, such as preventing moisture from entering the semiconductor stack 12, and can increase the adhesion between the insulating stack 50 and the semiconductor stack 12, thereby improving the reliability of the light-emitting device.

The first electrode pad 20A is formed on the insulating stack 50, contacts the first contact parts 201 and 201' through the opening 501, and electrically connects the first semiconductor layer 121. The second electrode pad 30A is formed on the insulating stack 50, contacts the second contact parts 301 and 301' through the opening 502, and electrically connects the second semiconductor layer 122. In one embodiment, as shown in FIG. 1A, the first electrode pad 20A does not cover the second contact electrode 30 and the second electrode pad 30A does not cover the first contact electrode 20. More specifically, the first electrode pad 20A does not cover the second contact parts 301, 301' and the second finger parts 302. The second electrode pad 30A does not cover the first contact parts 201, 201' and the first finger part 202.

The materials of the first electrode pad 20A and the second electrode pad 30A include metal, such as Cr, Ti, W, Au, Al, In, Sn, Ni, Pt, Ag or an alloy or a laminated stack of the above materials. For example, the first electrode pad 20A and the second electrode pad 30A include Al/Pt, Ti/Au, Ti/Pt/Au, Cr/Au, Cr/Pt/Au, Ni/Au, Ni/Pt/Au, Cr/Al/Ti/Pt, Ti/Al/Ti/Pt/Ni/Pt, Cr/Al/Ti/Al/Ni/Pt/Au, Cr/Al/Cr/Ni/Au or Ag/NiTi/TiW/Pt. The first electrode pad 20A and the second electrode pad 30A can provide a current path for an external power source to supply power to the first semiconductor layer 121 and the second semiconductor layer 122. In one embodiment, the first electrode pad 20A and the second electrode pad 30A comprise multilayer structures. For example, the metal structures in the first electrode pad 20A and the second electrode pad 30A which connect the first electrode pad 20A and the second electrode pad 30A to the external power source can be a stack composed of Au and Sn or a stack composed Sn and Ag, wherein Au or Ag can be the last layer of the first electrode pad 20A and the second electrode pad 30A. The thickness ratio of the Au layer to the Sn layer or the thickness ratio of the Ag layer to the Sn layer ranges from 0.25% to 2.25%. The first electrode pad 20A and the second electrode pad 30A have thicknesses in a range of 0.8-100 μm. In another embodiment, in a range of 1-60 μm. In still another embodiment, in a range of 1.1-6 μm. In one embodiment, the first electrode pad 20A and the second electrode pad 30A include Sn with a thickness in a range of 3.5-8.5 μm. In one embodiment, the first electrode pad 20A and/or the second electrode pad 30A includes SnAg alloy with a thickness in a range of 8-10 μm.

Figure 3:
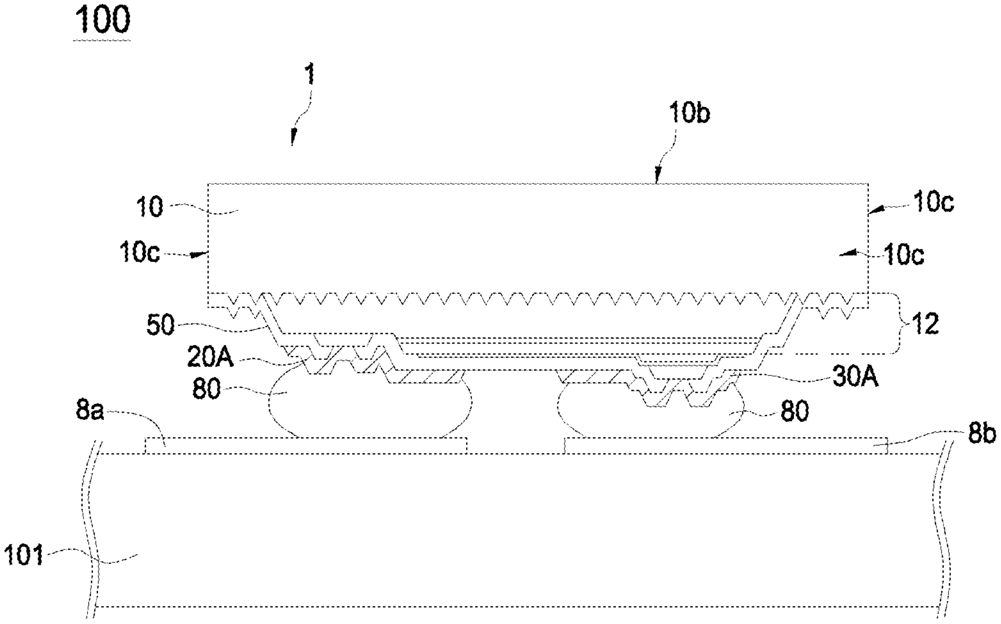
FIG. 3 shows a light-emitting module in accordance with an embodiment of the present application.

FIG. 3 shows a light-emitting module 100 in accordance with an embodiment of the present application. The light-emitting module 100 includes a carrier 101, and the carrier 101 is provided with circuit bonding pads 8*a* and 8*b*. The first electrode pad 20A and the second electrode pad 30A of the light-emitting device 1 are connected to the circuit bonding pads 8*a* and 8*b* through a conductive bonding layer 80 in a flip-chip manner. In one embodiment, the bonding method includes but not limited to solder bonding, wherein the conductive bonding layer 80 includes solder. In this way, most light emitted by the semiconductor stack 12 is extracted through the backside surface 10*b* and the side surfaces 10*c* of the substrate 10. In an embodiment, the light-emitting module 100 may further include a transparent encapsulant (not shown) on the carrier 101 to cover the light-emitting device 1. The transparent encapsulant includes silicone, epoxy, acrylic or a combination thereof, and the like. In one embodiment, the light-emitting device 1 further includes a reflective structure (not shown) disposed on the backside surface 10*b* of the substrate 10 for reflecting the light emitted from the semiconductor stack 12, so that most light can be extracted through the side surfaces 10*c* of the substrate 10. The details of the reflective structure can be referred to the insulating stack 50 described in the above embodiments.

Figure 4A:
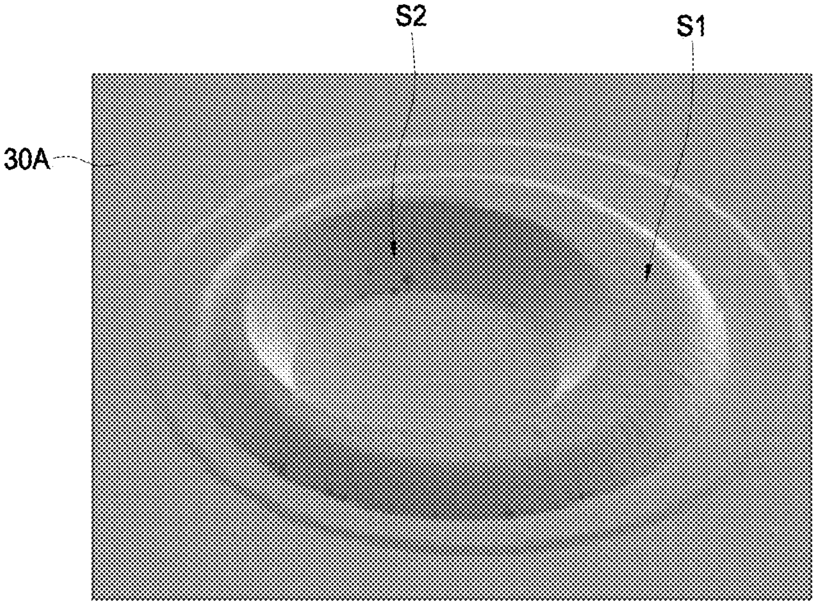
FIG. 4A shows a partially enlarged image of a light-emitting device in accordance with an embodiment of the present application.
Figure 4B:
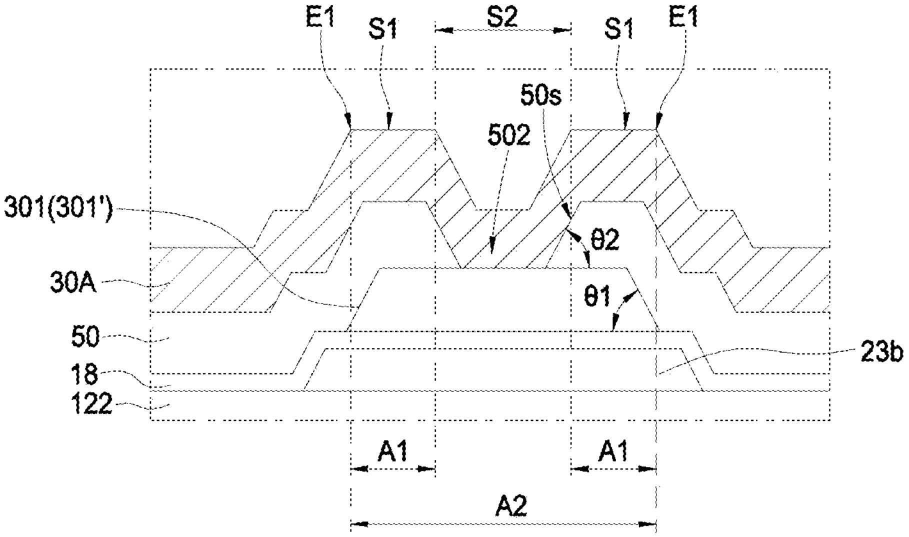
FIG. 4B shows a partially enlarged cross-sectional view of a light-emitting device in accordance with an embodiment of the present application.

FIG. 4A shows a partially enlarged image of a region near the opening 502. The image shows that the second insulating portion 23*b* and the second contact part 301' formed thereon have the same shape. FIG. 4B shows a partially enlarged cross-sectional view near the opening 502, that is, the enlarged view of the region R2 in FIG. 1B, which can also represent a cross-sectional view of the region R1 along the X-X' line in FIG. 1A.

As shown in FIG. 4B, a second acute angle θ2 is formed between the sidewall 50*s* of the insulating stack 50 at the opening 502 and the upper surface (or XY plane) of the second contact part 301 (301'), and a first acute angle θ1 is formed between the second contact part 301 (301') and the upper surface (or XY plane) of the transparent conductive layer 18. The first acute angle θ1 and the second acute angle θ2 are not greater than 80 degrees. In one embodiment, θ1 and θ2 are between 30 degrees and 80 degrees. The insulating stack 50 conformably covers the sidewalls and the upper surface of the second contact electrode 301. The second electrode pad 30A conformably covers the insulating stack 50 and the sidewalls of the opening 502, so that the upper surface of the second electrode pad 30A forms a platform area S1 and a depression area S2 on the second contact part 301 (301'). The platform area S1 has a maximum height relative to other areas of the upper surface of the second electrode pad 30A, and the depression area S2 is correspondingly located in the opening 502 and surrounded by the platform area Si. The platform area Si is, for example, ring-shaped and has a flat upper surface. The depression area S2, for example, includes an annular inclined surface surrounding a flat bottom surface, wherein the inclined surface is between the flat upper surface and the flat bottom surface.

Figure 5A:
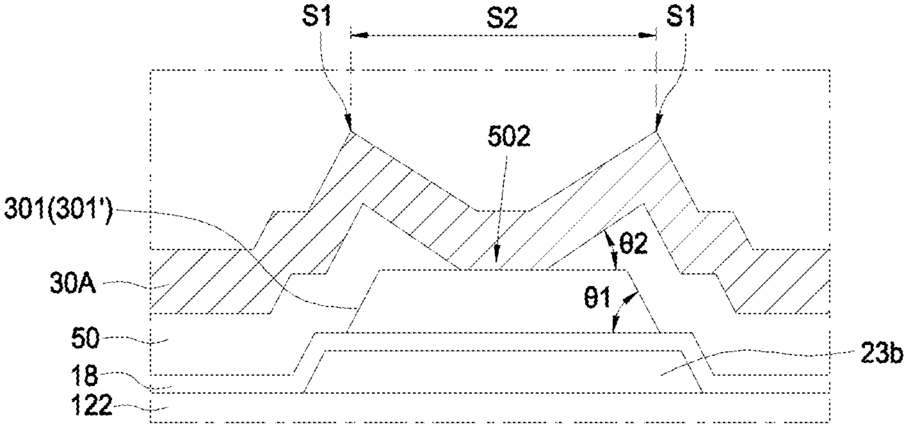
FIGS. 5A and 5B respectively show partially enlarged cross-sectional views of light-emitting devices of different comparative examples.
Figure 5B:
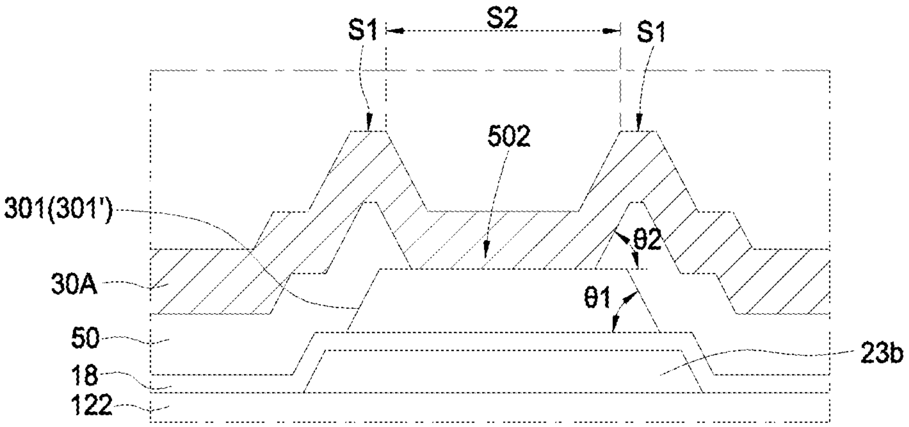

Referring to FIG. 3, during the process of bonding the light-emitting device 1 to the carrier 101, since the platform area S1 of the upper surface of the second electrode pad 30A has the maximum height, the platform area Si is the part of the light-emitting device 1 that first contacts the conductive bonding layer 80. Therefore, the stress may concentrate at the platform area Si. If the area of the platform area Si is too small, the stress may be large enough to cause damage or crack on the insulating stack 50 near the opening 502, especially at the part where the insulating stack 50 has a crease. As a result, the performance of the light-emitting device 1 may fail. The area of the platform area S1 is related to the thickness of the insulating stack 50, the second acute angle θ2, the thickness of the second contact part 301 (301'), the first acute angle θ1, and the width of the opening 502. FIGS. 5A and 5B respectively show different comparative examples of the region R2 in FIG. 1B. Referring to the comparative example shown in FIG. 5A, it has the same structure as the embodiment shown in FIG. 4B and the opening 502 shown in FIG. 5A has the same bottom width as that of the opening 502 shown in FIG. 4B. The difference is that the comparative example has a smaller second acute angle θ2. In general, when the second acute angle θ2 is smaller, that is, the slope of the sidewall of the opening 502 is gentler, which is beneficial to forming the second electrode pad 30A thereon. However, the area of the platform area S1 of the upper surface of the second electrode pad 30A decreases as the second acute angle θ2 becomes smaller. If the second acute angle θ2 is too small, the stress may be large and cause the light-emitting device 1 to fail. Referring to the comparative example shown in FIG. 5B, it has the same structure as the embodiment shown in FIG. 4B and the second acute angle θ2 shown in FIG. 5B has the same degrees as that of the second acute angle θ2 shown in FIG. 4B. The difference is that the opening 502 in the comparative example shown in FIG. 5B has a lager bottom width than that of the opening 502 shown in FIG. 4B. In general, the wider the opening 502 is, the larger the contact area between the second electrode pad 30A and the second contact electrode 30 is, which benefits the conduction of current. However, as shown in FIG. 5B, when the width of the opening 502 is too large, the area of the platform area Si is reduced, which may lead to the situation of concentrated stress discussed above. Therefore, in the present embodiment, by adjusting the thickness of the second electrode pad 30A, the thickness of the insulating stack 50 and the second acute angle θ2, the thickness of the second contact part 301 (301') and the first acute angle θ1, and the width of the opening 502, the area of the projection of the platform area S1 on the horizontal plane (XY plane) is designed within a specific range. Referring to the cross-sectional view shown in FIG. 4B, the area of the projection of the platform area S1 on the horizontal plane (XY plane) is A1, and the sum of the areas of the projections of the platform area S1 and the depression area S2 on the horizontal plane (XY plane) is A2, where A1/A2 ranges from 50%-80%, and the second acute angle θ2 is between 30 degrees and 80 degrees. In this way, step coverage of the second electrode pad 30A on the opening 502 and reduction of the stress can be both considered and the reliability of the insulating stack 50 can be improved.

Figure 6:
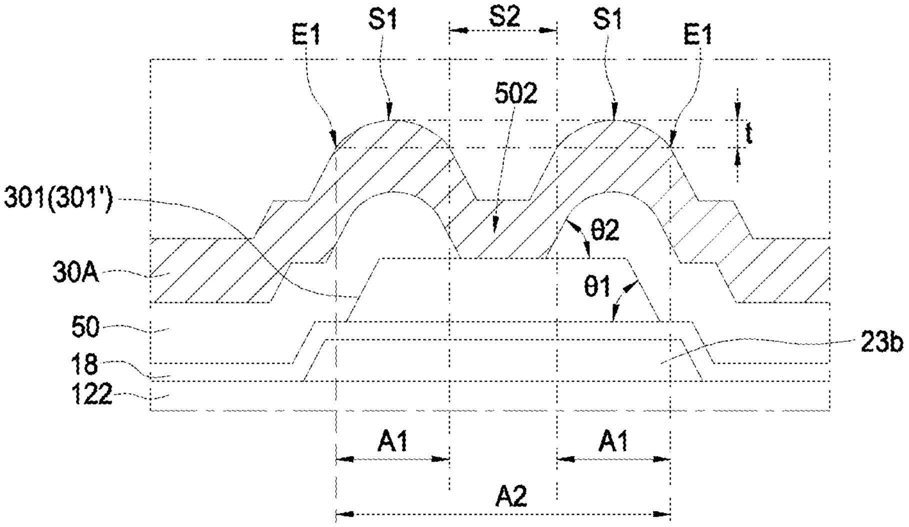
FIG. 6 shows a partially enlarged cross-sectional view of a light-emitting device in accordance with another embodiment of the present application.

FIG. 6 shows another embodiment of the region R2 in FIG. 1B, which is a partially enlarged cross-sectional view near the opening 502 and the second contact part 301 (301'). By controlling the etching conditions of the insulating stack 50, the sidewall of the opening 502 forms a curved surface near the opening 502, so that the corresponding portion of the second electrode pad 30A can be also a curved surface. That is, the platform area Si can be substantially a plane as shown in FIG. 4A and FIG. 4B, or it can include a curved surface as shown in FIG. 6, or include a curved surface at the boundary between the platform area S1 and the depression area S2. As shown in FIG. 6, an area within a range from the highest point of the upper surface of the second electrode pad 30A downward to a height t is defined as the platform area Si, wherein t is 1 μm. Similarly, the depression area S2, the areas of projections A1 and A2 are defined in accordance with the definition of the platform area S1, wherein A1/A2 is between 50% and 80%, and the second acute angle θ2 is between 30° and 80°.

In one embodiment, as shown in FIG. 4B and FIG. 6, the projection position of the outermost edge E1 of the platform area S1 on the horizontal plane (XY plane) is within a projection of the sidewall of the second contact part 301 (301') on the horizontal plane (XY plane). When the light-emitting device 1 is subsequently bonded to the carrier 101, the stress of the insulating stack 50 near the opening 502 can be reduced and the reliability of the light-emitting device 1 can be improved.

Figure 7A:
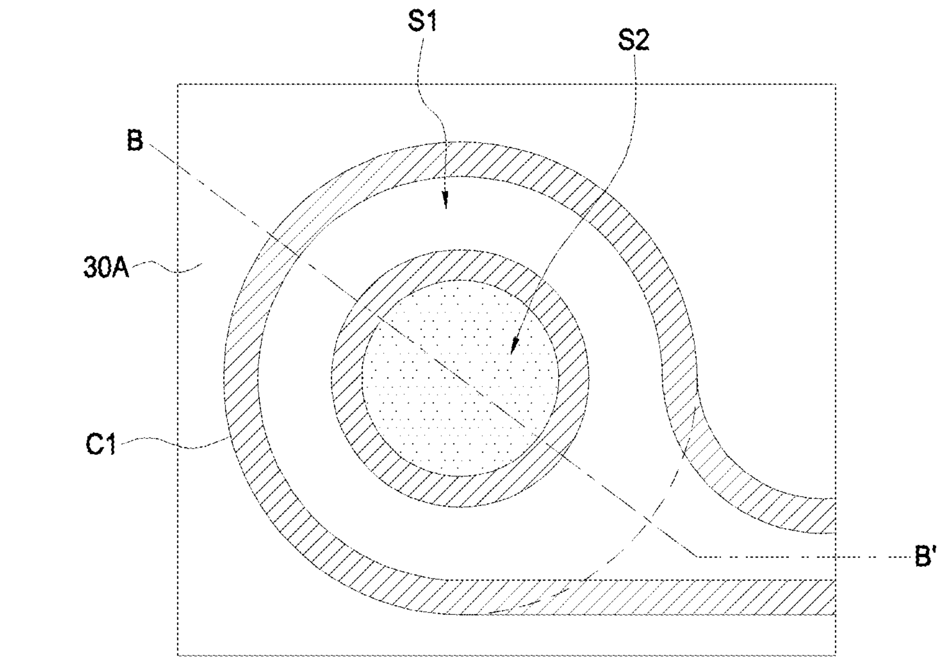
FIG. 7A shows a partially enlarged view of a region R1 in FIG. 1A.
Figure 7B:
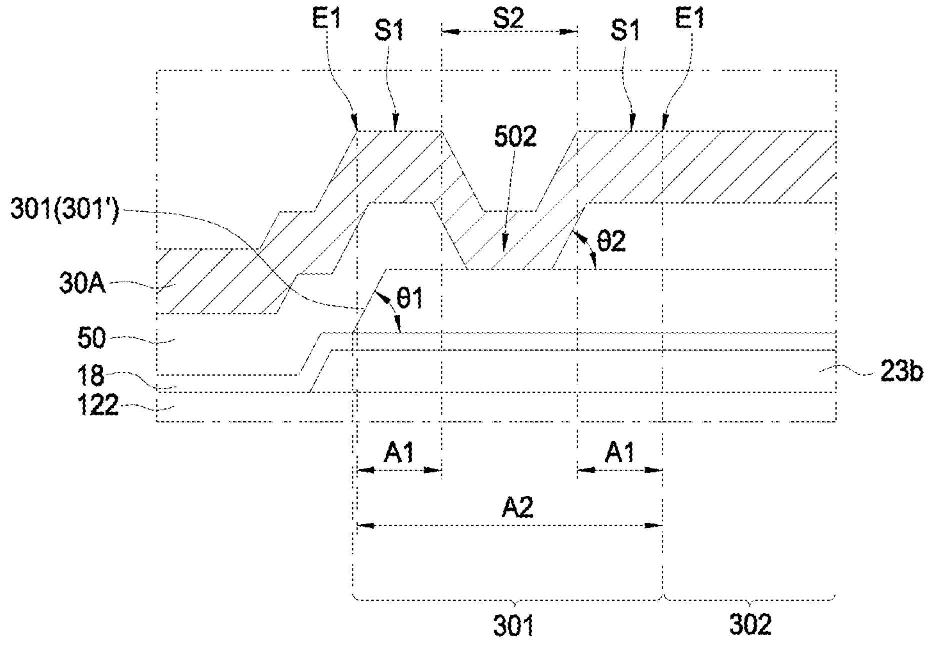
FIG. 7B shows a cross-sectional view taken along B-B' line in FIG. 7A.

FIG. 7A shows a partially enlarged schematic view of the region R1 in FIG. 1A. FIG. 7B shows a cross-sectional view taken along the B-B' line in FIG. 7A. The cross-sectional structure taken along the B-B' line of the region R1 is like that shown in FIG. 4B, and the difference is that the second contact electrode 20 includes second finger part 302 extending from the second contact part 301. As discussed above, the platform area S1 where stress may concentrate is located near the opening 502 above the second contact portion 302, that is, within the range of the outer contour Cl of the second contact part 302 as shown in FIG. 7A. Similarly, in the present embodiment, A1/A2 is between 50%-80%, and the second acute angle θ2 is between 30° and 80°.

In one embodiment of the present application, the current blocking structure 23 (23*a*, 23*b*) includes an insulating stack. For example, the current blocking structure 23 (23*a*, 23*b*) include a pair or a plurality of pairs of insulating layers with different refractive indices. The current blocking structure 23 can be the same as the insulating stack 50 described in the embodiments shown in FIG. 2A and FIG. 2B, which can reflect light within a specific wavelength range and/or a specific incident angle range. When the light emitted from the semiconductor stack 12 and then towards the first contact electrode 20 and the second contact electrode 30, it can be reflected by the first insulating portion 23*a* under the first contact electrode 20 and the second insulating portion 23*b* under the second contact electrode 30 and extracted from other parts of the light-emitting device 1, so that brightness of the light-emitting device 1 can be improved. In one embodiment, the current blocking structure 23 (23*a*, 23*b*) has a reflectivity of more than 60% with respect to the dominant wavelength and/or peak wavelength of the light-emitting device 1. The thickness of the current blocking structure 23 (23*a*, 23*b*) is between 0.1 μm-2 μm, in one embodiment, between 0.2 μm-1 μm. In one embodiment, the thickness of the current blocking structure 23 (23 *a*, 23*b*) is less than the thickness of the insulating stack 50 and greater than the thickness of the first contact electrode 20 and the second contact electrode 30. In one embodiment, the number of the pairs of the insulating layers in the current blocking structure 23 (23*a*, 23*b*) is smaller than that in the insulating stack 50. In generally, the larger the area of the current blocking structure 23 (23*a*, 23*b*), the larger the reflection area can be provided and the brightness of the light-emitting device can be improved. However, if the area of the current blocking structure 23 (23*a*, 23*b*) is larger, the forward voltage (Vf) of the light-emitting device 1 may increase and the efficiency of the light-emitting device 1 is decreased. Therefore, in one embodiment, the difference between the width of the current blocking structure 23 (23*a*, 23*b*) and the width of the contact electrodes 20 and 30 directly above it is between 1 μm-15 μm.

Figure 8A:
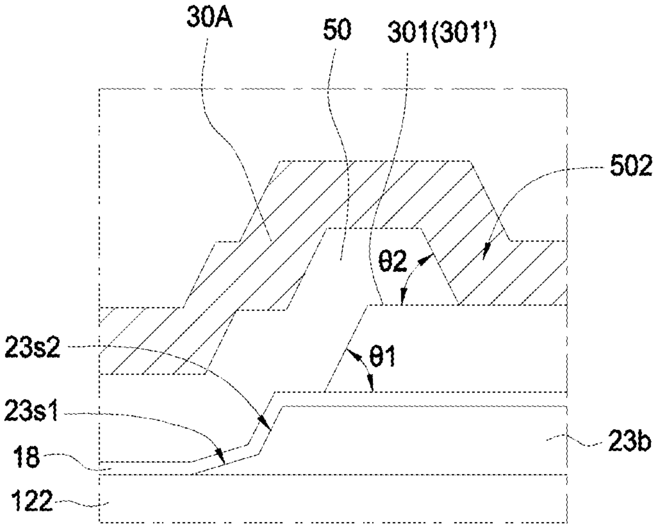
FIG. 8A shows a partially enlarged view of a left part of FIG. 7B.
Figure 8B:
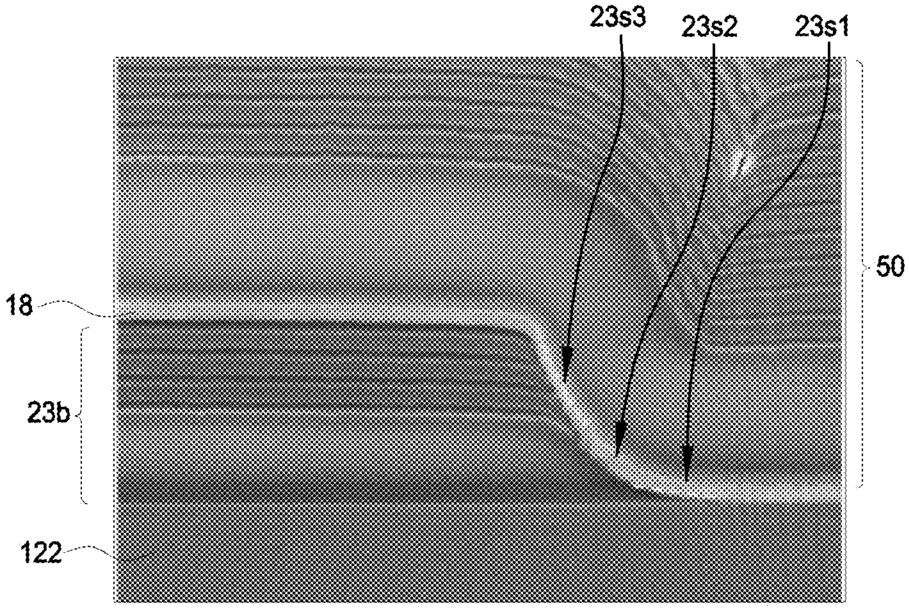
FIG. 8B and FIG. 8C show microscopic images of a light-emitting device in accordance with different embodiments of the present application.
Figure 8C:
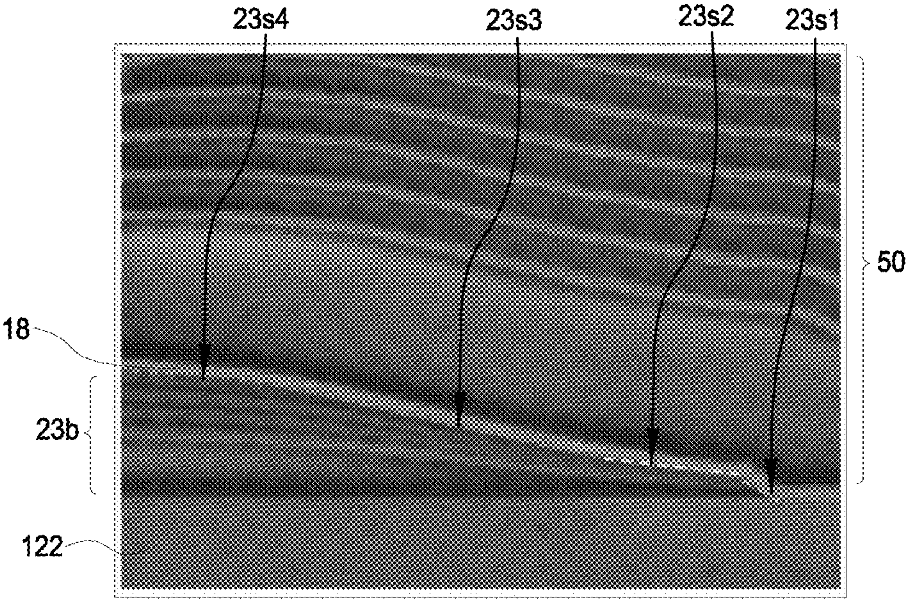

FIG. 8A shows a partially enlarged view of the left side of FIG. 7B. In one embodiment, the current blocking structure 23 is formed on the semiconductor stack 12 by the method for forming the insulating stack 50 described above, and then patterned by a photoresist lift-off method. As shown in FIG. 8A, the sidewall of the current blocking structure 23 includes a plurality of sub-sidewalls. For example, as shown in FIG. 8A, the sidewall of the second insulating portion 23*b* includes a first sub-sidewall 23*s*1 and a second sub-sidewall 23*s*2. The first sub-sidewall 23*s*1 and the second sub-sidewall 23*s*2 have different slopes with respect to the horizontal plane, for example, the slope of the first sub-sidewall 23*s*1 is smaller than that of the second sub-sidewall 23*s*2. In this way, the transparent conductive layer 18 and the insulating stack 50 on the current blocking structure 23 can have better step coverage and the risk of cracks can be lowered. FIG. 8B and FIG. 8C are SEM images showing different examples of FIG. 8A. As shown in FIG. 8B, the sidewall of the second insulating portion 23*b* includes a first sub-sidewall 23*s*1, a second sub-sidewall 23*s*2 and a third sub-sidewall 23*s*3. The slope of the first sub-sidewall 23*s*1 is smaller than the slope of the second sub-sidewall 23*s*2. The slope of the second sub-sidewall 23*s*2 is smaller than the slope of the third sub-sidewall 23*s*3. The length of the third sub-sidewall 23*s*3 is greater than the length of the first sub-sidewall 23*s*1, or greater than the length of the second sub-sidewall 23*s*2. In another example shown in FIG. 8C, the sidewall of the second insulating portion 23*b* includes a first sub-sidewall 23*s*1, a second sub-sidewall 23*s*2, a third sub-sidewall 23*s*3 and a fourth sub-sidewall 23*s*4. The slope of the first sub-sidewall 23*s*1 is greater than that of the fourth sub-sidewall 23*s*4, for example, the relationship between the slopes of the sub-sidewalls can be: first sub-sidewall 23*s*1>the second sub-sidewall 23*s*2 and third sub-sidewall 23*s*3>the fourth sub-sidewall 23*s*4. In another embodiment, the slope of the first sub-sidewall 23*s*1 is not greater than 45 degrees. The above description about the sidewall of the second insulating portion 23*b* is also applicable to the sidewall of the first insulating portion 23*a*. The length of the third sub-sidewall 23*s*3 is greater than the length of the first sub-sidewall 23*s*1, or greater than the length of the fourth sub-sidewall 23*s*4, or greater than the length of the second sub-sidewall 23*s*2.

Figure 9A:
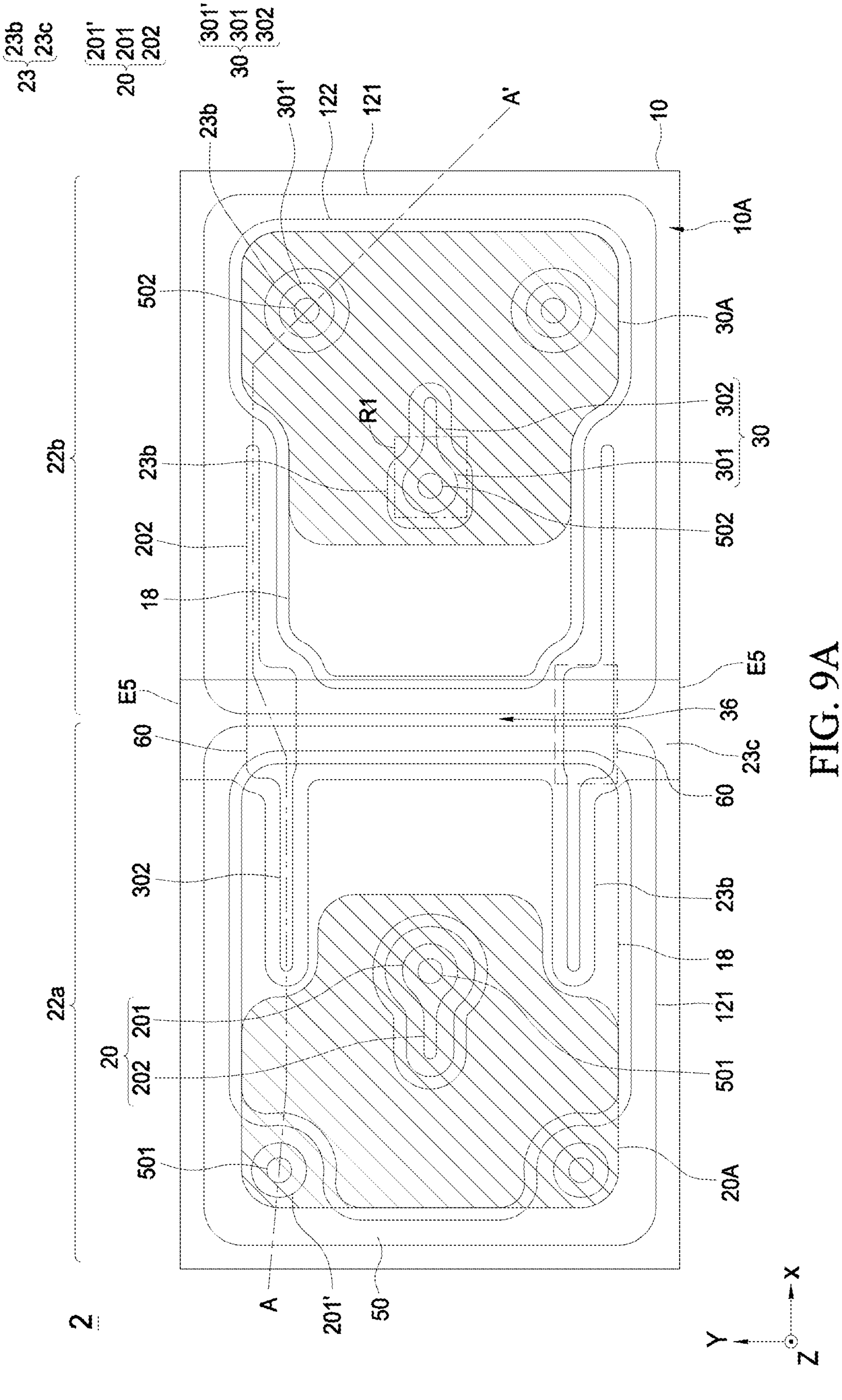
FIG. 9A shows a top view of a light-emitting device in accordance with another embodiment of the present application.
Figure 9B:
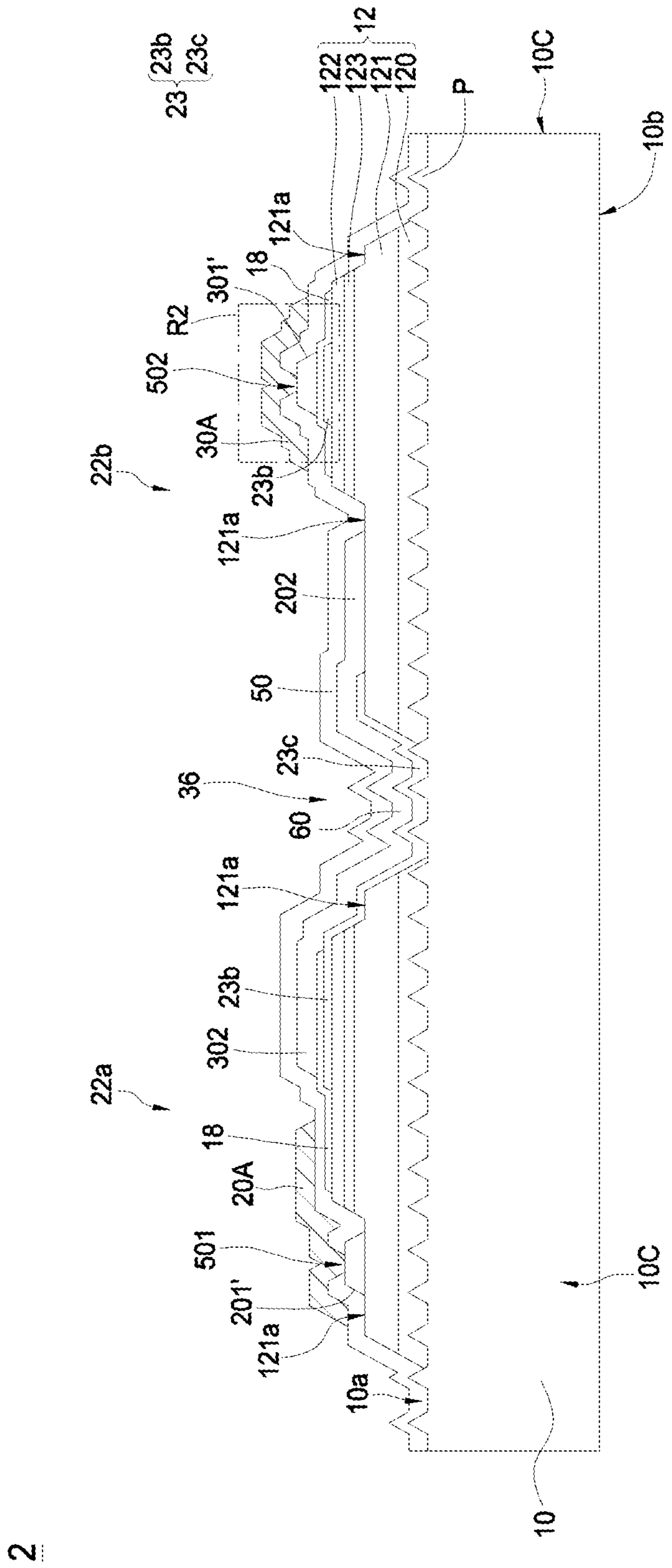
FIG. 9B shows a cross-sectional view taken along A-A' line in FIG. 9A.
Figure 9C:
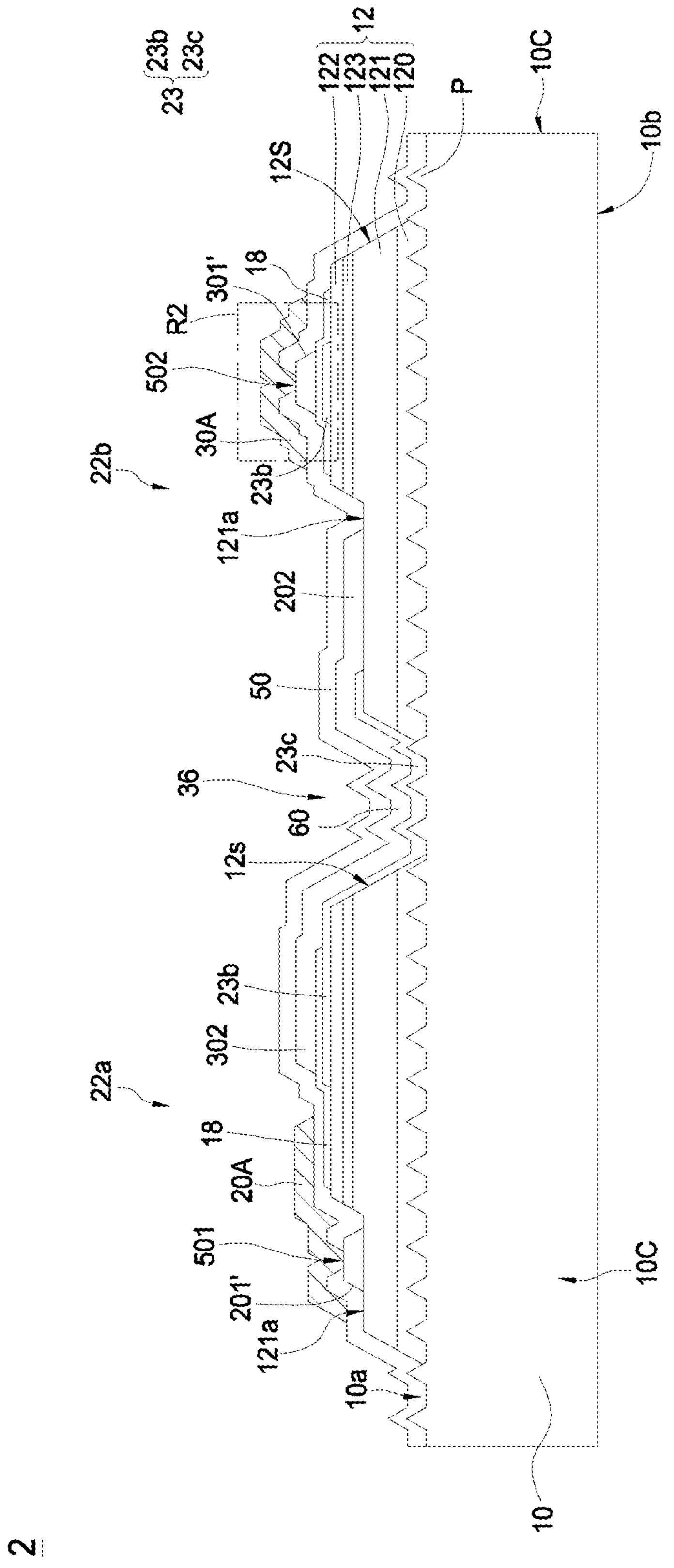
FIG. 9C shows a cross-sectional view of a light-emitting device in accordance with another embodiment of the present application.

FIG. 9A shows a light-emitting device 2 in accordance with another embodiment of the present application. FIG. 9B shows a cross-sectional view taken along A-A' line in FIG. 9A. The difference between the light-emitting device 2 and the light-emitting device 1 is that the light-emitting device 2 includes a plurality of light-emitting units, such as light-emitting units 22*a* and 22*b*, separately arranged on the upper surface 10*a* of the substrate 10. The light-emitting units 22*a* and 22*b* each include the semiconductor stack 12 and are separated from each other by a trench 36. The light-emitting unit 22*a* and 22*b* are arranged along the long side of the light-emitting device 2. The upper surface 10*a* of the substrate 10 includes a street area not covered by the semiconductor stacks 12, and the street area is located at a periphery of the light-emitting device 2 and surrounds the light-emitting units 22*a* and 22*b*. In the present embodiment, the upper surfaces 121*a* of the first semiconductor layers 121 of each semiconductor stacks 12 include a contact area for forming the first contact electrode 20 thereon and a surrounding platform located on the periphery of the semiconductor stack 12, surrounding the active region 123 and the second semiconductor layer 122, wherein the contact area and the surrounding platform are not covered by the active region 123 and the second semiconductor layer 122. In another embodiment shown in FIG. 9C, the upper surface 121*a* of the first semiconductor layer 121 does not include the surrounding platform. Therefore, as shown in FIG. 9C, the sidewall 12*s* of the semiconductor stack 12 forms a continuous slope from the second semiconductor layer 122 downward to the first semiconductor layer 122.

As shown in FIG. 9A, the light-emitting device 2 further includes a plurality of conductive structures 60 formed between adjacent light-emitting units 22*a* and 22*b* and on each light-emitting units 22*a* and 22*b*. Both ends of the conductive structure 60 are respectively connected to the contact electrodes on the light-emitting units 22*a* and 22*b*, so that the light-emitting unit 22*a* and 22*b* are electrically connected in serial or in parallel and form a light-emitting unit array. For example, one end of each conductive structure 60 is connected to the second finger part 302 on the light-emitting unit 22*a*, and the other end is connected to the first finger part 202 on the light-emitting unit 22*b*, so that the light-emitting units 22*a* and 22*b* are electrically connected in series. The material of the conductive structure 60 includes metal, for example, includes the same metal material as that of the contact electrodes 20 and 30. The second finger part 302 on the light-emitting unit 22*a* is arranged along the long side of the light-emitting unit 22*a*, and the length of the second finger part 302 on the light-emitting unit 22*a* is at least 30% of the length of the long side of the light-emitting unit 22*a*. The first finger part 202 on the light-emitting unit 22*b* is arranged along the long side of the light-emitting unit 22*b*, and the length of the first finger part 202 on the light-emitting unit 22*b* is at least 30% of the length of the long side of the light-emitting unit 22*b*. In one embodiment, the width of the conductive structure 60 is greater than the width of the first finger part 202 and/or the width of the second finger part 302. The second finger part 302 on the light-emitting unit 22*a* and the first finger part 202 on the light-emitting unit 22*b* are respectively connected to diagonal corners of the conductive structure 60.

The light-emitting device 2 includes the trench 36 located between two adjacent light-emitting units 22*a* and 22*b*, the bottom of the trench 36 includes the upper surface 10*a* of the substrate 10, and the sidewalls of the trench 36 is defined by the two sidewalls facing each other of the two adjacent light-emitting units 22*a* and 22*b*. In the present embodiment, the current blocking structure 23 includes a second insulating portion 23*b* and a third insulating portion 23*c*. The second insulating portion 23*b* includes a plurality of separation parts respectively located between the second finger part 302 on the light-emitting unit 22*a* and the second semiconductor layer 122, and between the second contact electrode 30 and the second semiconductor layer 122 on the light-emitting unit 22*b*. The third insulating portion 23*c* covers the trench 36, more specifically, the third insulating portion 23*c* covers the upper surface 10*a* of the substrate 10 in the trench 36, and the opposite sidewalls of the light-emitting units 22*a* and 22*b* near the trench 36, and further extends onto the semiconductor stack 12 of the light emitting units 22*a* and 22*b*. The third insulating portion 23*c* is connected to part of the second insulating portion 23*b*. As shown in FIG. 9A, the plurality of conductive structures 60 are separately disposed between the light-emitting units 22*a* and 22*b*, and are respectively adjacent to two opposite long sides of the light-emitting device 2. The third insulating portion 23*c* can be a single element located below the plurality of conductive structures 60 and disposed along the trench 36. The third insulating portion 23*c* covers the entire trench 36 and extends to the street area of the upper surface 10*a* of the substrate. That is, the length of the third insulating portion 23*c* in Y direction is substantially equal to the length of the light-emitting device 2 in Y direction (the length of the short side). In one embodiment, as shown in FIG. 9A, the edge E5 of the third insulating portion 23*c* is aligned with the long side of the light-emitting element 2. In another embodiment (not shown), the third insulating portion 23*c* is disposed along the trench 36, covering the entire trench 36 but not covering the street area of the upper surface 10*a* of the substrate 10. In another embodiment (not shown), the third insulating portion 23*c* of the light-emitting device 2 includes a plurality of separated insulating portions disposed under the plurality of conductive structures 60 respectively.

The insulating stack 50 covers the semiconductor stacks 12 of the light-emitting units 22*a* and 22*b*, the plurality of conductive structures 60 and the trench 36, wherein the insulating stack 50 includes a plurality of openings 501 located on the light-emitting unit 22*a* and a plurality of openings 502 located on the light-emitting unit 22*b*. The first electrode pad 20A is formed on the insulating stack 50, and connects to the first contact parts 201 and 201' thereunder through the plurality of openings 501. As shown in FIG. 9A, the number of the plurality of openings 501 is, for example, three. The second electrode pad 30A is formed on the insulating stack 50 and connects to the second contact parts 301 and 301' thereunder through the plurality of openings 502. As shown in FIG. 9A, the number of the plurality of openings 502 is, for example, three. The first electrode pad 20A does not cover the second finger parts 302 on the light-emitting unit 22*a*, and the second electrode pad 30A does not cover the first finger parts 202 on the light-emitting unit 22*b*. Specifically, the first electrode pad 20A does not overlap the second contact electrode 30 in Z direction. The first electrode pad 30A does not overlap the first contact electrode 20 in Z direction. Therefore, if the insulating stack 50 is damaged or cracked, the electrode pad is not short-circuited with the contact electrode of a different conductivity type. As shown in FIG. 9A, the first contact electrodes 20 (201, 201', 202) on the light-emitting unit 22*a* and the second contact electrodes 30 (301, 301', 302) on the light-emitting unit 22*b* are substantially symmetric with respect to the trench 36. As a result, current distribution and brightness in the light-emitting units 22*a* and 22*b* can be uniform. If the details of each elements of the light-emitting device 2, such as material, thickness, sidewall angle, are not specifically described in this embodiment and have the same name and same label as those of the light-emitting device 1, the details can be referred to the description of the light-emitting device 1, and will not be repeated.

Figure 10:
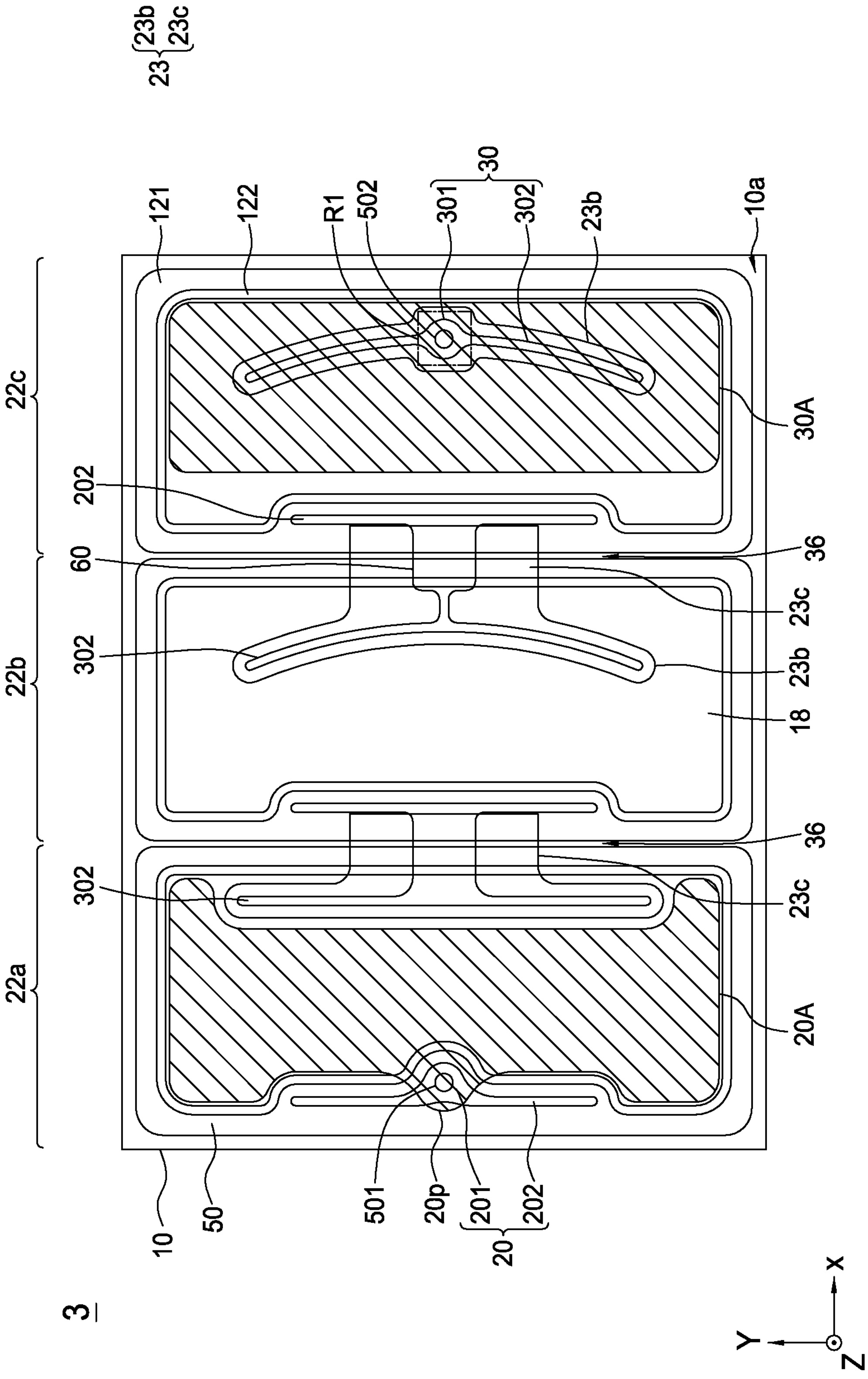
FIG. 10 shows a top view of a light-emitting device in accordance with another embodiment of the present application.

FIG. 10 shows a light-emitting device 3 in accordance with another embodiment of the present application. Both the light-emitting device 3 and the light-emitting device 2 include a light-emitting unit array, and the difference is that the light-emitting device 3 includes three light-emitting units 22*a*-22*c* arranged on the substrate 10, and the short sides of each light-emitting unit 22*a*-22*c* are arranged along the long side of the light-emitting device 3. The adjacent light-emitting units 22*a*-22*c* are electrically connected by a single conductive structure 60. If the details of each element of the light-emitting device 3, such as material, thickness, sidewall angle, are not specifically described in this embodiment and have the same name and same label as those of the light-emitting device 1 or the light-emitting device 2, the details can be referred to the descriptions of the light-emitting device 1 or the light-emitting device 2, and will not be repeated.

As shown in FIG. 10, the first contact electrode 20 and the second finger part 302 on the light-emitting unit 22*a*, are respectively disposed along the long sides of the light-emitting unit 22*a*. The first electrode pad 20A is formed on the insulating stack 50 above the light-emitting unit 22*a* and connected to the first contact part 201 through the opening 501. In the top view, the first electrode pad 20A bypasses the first finger part 202 and the second finger part 302, and does not overlap the first finger part 202 and the second finger part 302 in Z direction. In addition, the first electrode pad 20A includes the protruding portion 20*p* overlapping the first contact part 201 in Z direction. In one embodiment, the protruding portion 20*p* is at least 1 μm beyond the edge of the first contact part 201. The second finger part 302 on the light-emitting unit 22*b* is arc-shaped, and in one embodiment, the arc bypasses a central area of the light-emitting device 3. Conventional light-emitting device is attached to a temporary layer (such as blue tape) in chip form, and then an ejector pin is applied to the temporary layer to detach the light-emitting device during subsequent process. The point of force application of the ejector pin roughly corresponds to the central area between the two electrode pads of the light-emitting device, the first electrode pad 20A and the second electrode pad 30A, for example. In the light-emitting device 3 in accordance with the present embodiment, the second finger part 302 formed on the light-emitting unit 22*b* bypasses the central area of the light-emitting device 3 so the central area of the light-emitting device 3 is flat. Applying the ejector pin on the flat central area of the light-emitting device 3 can reduce the risk of failure of the light-emitting device 3 during the detaching process. The second electrode pad 30A is formed on the insulating stack 50 above the light-emitting unit 22*c* and connected to the second contact part 201 through the opening 502.

In another embodiment, the light-emitting device 2 or 3 further includes a reflective structure (not shown) disposed on the backside surface 10*b* of the substrate 10 to reflect the light emitted from the semiconductor stack 12, so that most light can be extracted from the side surfaces 10*c* of the substrate 10. The reflective structure can be formed by stacking one or more pairs of insulating layers with different refractive indices, like the insulating stack 50 described in the aforementioned embodiments.

The light-emitting device in accordance with any embodiment of the present application, such as light-emitting device 2 and 3, can be applicable to the light-emitting module shown in FIG. 3. The light-emitting device 1 shown in FIG. 3 can be replaced by the light-emitting device in accordance with any other embodiments, and the first electrode pad 20A and the second electrode pad 30A of the light-emitting device in accordance with each embodiment can be respectively bonded to the circuit bonding pads 8*a* and 8*b* through the conductive bonding layer 80 to form the light-emitting module 100. Similarly, the detailed structures in the regions R1 and R2 of the light-emitting devices in different embodiments, such as the light-emitting devices 2 and 3, can also be referred to the structures described in FIG. 4A to FIG. 8 and will not be repeated in each embodiment.

Figure 11:
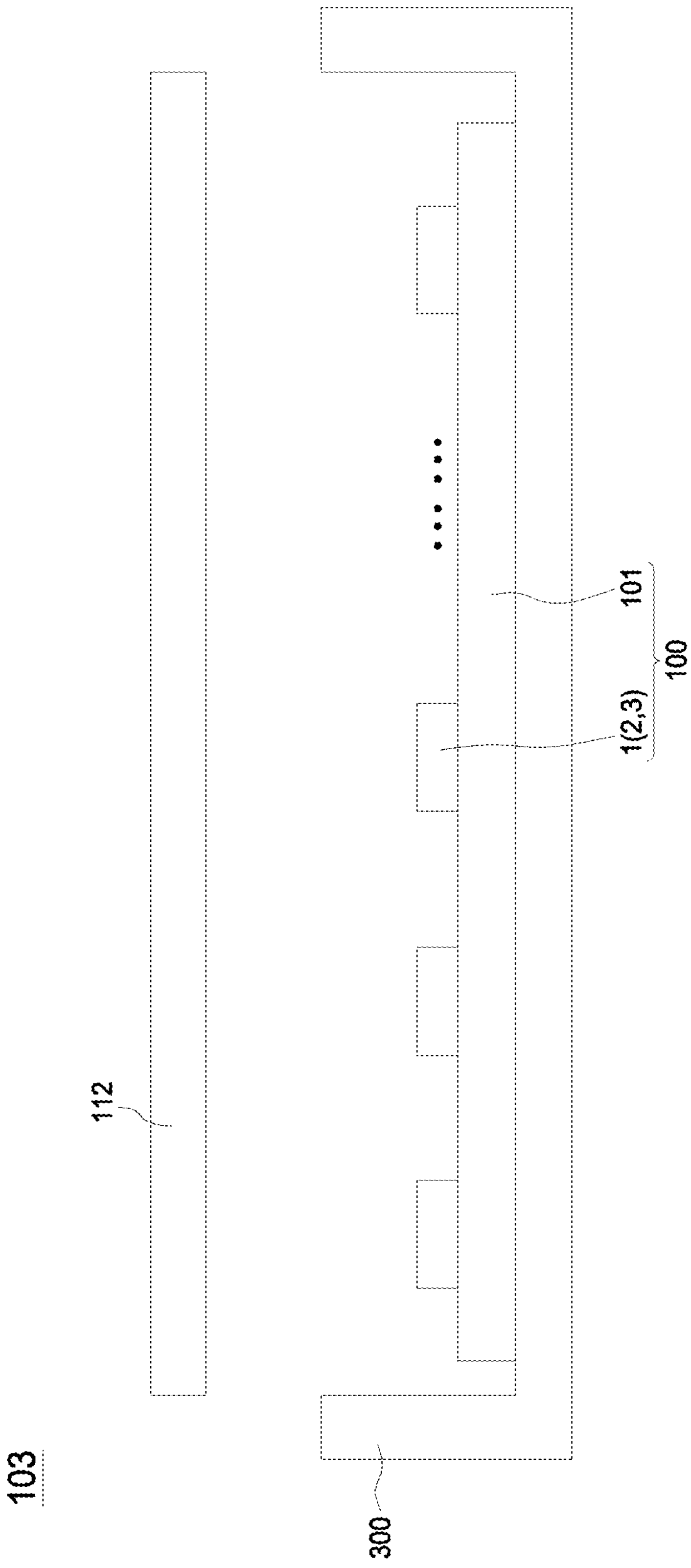
FIG. 11 shows a cross-sectional view of a backlight unit of a display apparatus.

FIG. 11 shows a cross-sectional view of a backlight unit 103 of a display apparatus, and the backlight unit 103 includes the light-emitting device in accordance with any of the embodiments in the present application. The backlight unit 103 includes a chassis 300 accommodating the light-emitting module 100 shown in FIG. 3, and an optical film 112 disposed on the light-emitting module 100. The optical film 112 includes, for example, a light diffuser. In the present embodiment, the backlight unit 103 is a direct-lit backlight unit. The light-emitting module 100 includes the carrier 101 and the light-emitting devices in accordance with any of the embodiments arranged on the carrier 101. In another embodiment (not shown), the light-emitting module 100 includes the carrier 101 and a plurality of light-emitting packages mounted on the carrier 101, and the light-emitting device in accordance with any of the embodiments is encapsulated in the light-emitting package and mounted on the carrier 101 in flip-chip manner.

Figure 12A:
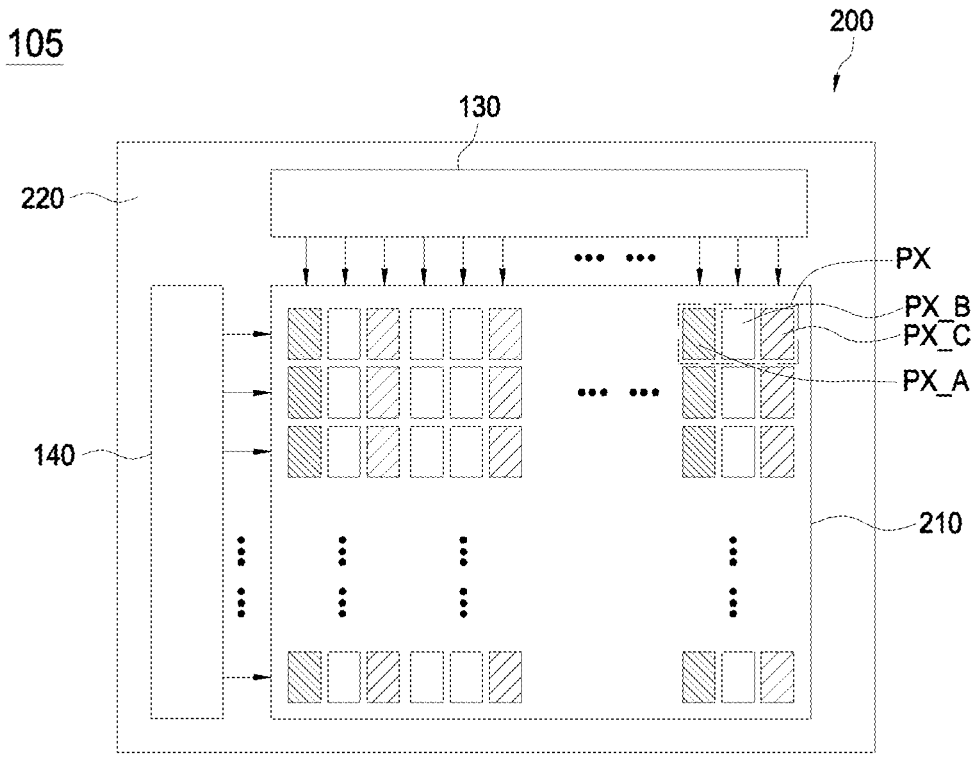
FIG. 12A shows a top view of a display apparatus 105.

FIG. 12A shows a top view of a display apparatus 105 which includes the light-emitting device in accordance with any embodiments of the present application. As shown in FIG. 12A, the display apparatus 105 includes a substrate 200, wherein the substrate 200 includes a display area 210 and a non-display area 220. A plurality of pixel units PXs are arranged in the display area 210 of the display substrate 200. Each pixel unit PX includes a plurality of sub-pixels PX_A, PX_B and PX C, and each of the sub-pixels emits light with different colors. A data driver 130 and a scanning driver 140 are provided in the non-display area 220 for controlling the pixel units PXs. The pixel unit PX includes the light-emitting device in accordance with any of the embodiments in the present application.

Figure 12B:
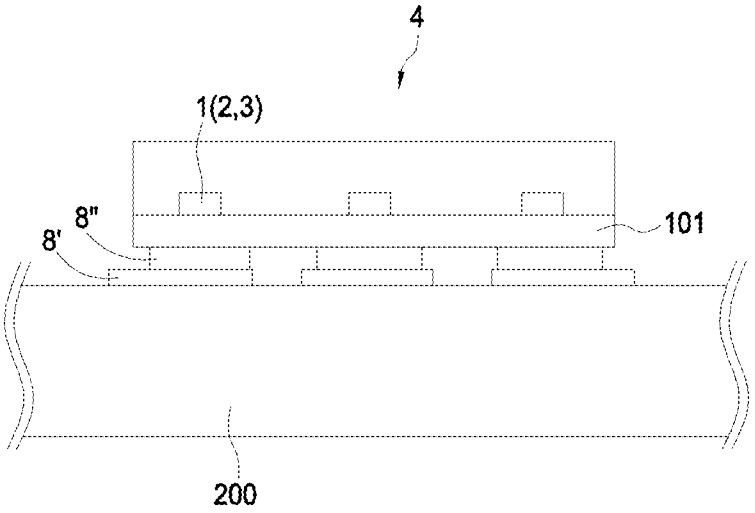
FIG. 12B shows a cross-sectional view of a pixel unit PX in FIG. 12A.

FIG. 12B shows a partial cross-sectional view of the pixel unit PX in FIG. 12A. The substrate 200 is provided with a circuit bonding pad 8' and a circuit (not shown), and the circuit includes active electronic components, such as transistors. A light-emitting package 4 is bonded to the substrate 200 in a flip-chip manner. Like the light-emitting module 100 shown in FIG. 3, the light-emitting package 4 includes a carrier 101, one side of the carrier 101 is provided with circuit bonding pads 8*a* and 8*b* (not shown in FIG. 12B) and a circuit (not shown in FIG. 12B). A plurality of light-emitting devices including the light-emitting device in accordance with any embodiment of the present application is mounted on the side of the carrier 101. The first electrode pad 20A and the second electrode pad 30A are respectively bonded to the circuit bonding pads 8*a* and 8*b* through the conductive bonding layer 80 in a flip-chip manner. The other side of the carrier 101 of the light-emitting element package 4 further includes a plurality of bonding pads 8", which are connected to the circuit bonding pads 8' on the substrate 200 so that the driving circuit on the substrate 200 is electrically connected to the plurality of light-emitting device.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:

a substrate;

a semiconductor stack, comprising a first semiconductor layer, an active region and a second semiconductor layer, wherein the semiconductor stack comprises a first unit, a second unit and a third unit separately disposed on the substrate;

a plurality of conductive structures formed between and electrically connecting the first unit, the second unit and the third unit;

a first contact electrode and a second contact electrode formed on the semiconductor stack, wherein the first contact electrode comprises a first contact part and a plurality of first finger parts formed on the first semiconductor layer and the second contact electrode comprises a second contact part and a plurality of second finger parts formed on the second semiconductor layer;

an insulating stack formed on the semiconductor stack, comprising an opening on the second contact part; and a first electrode pad and a second electrode pad formed on the insulating stack, wherein the second electrode pad is filled in the opening and connecting the second contact part;

wherein the second electrode pad comprises an upper surface, and the upper surface of the second electrode comprises a platform area and a depression area on the second contact part;

wherein the platform area has a maximum height relative to other areas of the upper surface of second electrode;

wherein an area of a projection of the platform area on a horizontal plane is A1, and a sum of areas of the projections of the platform area and the depression area on the horizontal plane is A2, and a ratio of A1/A2 ranges from 50% to 80%;

wherein the first contact part and the first electrode pad are formed on the first semiconductor layer of the first unit, and the second contact part and the second electrode pad are formed on the second semiconductor layer of the third unit;

wherein one of the plurality of second finger parts is formed on the second unit and comprises an arc bypassing a central area of the light-emitting device and a central area of the second unit.

2. The light-emitting device according to claim 1, further comprising a current blocking structure formed under the first contact electrode and/or the second contact electrode, and the current blocking structure comprises a plurality of insulating layers with different refractive indices alternately stacked.

3. The light-emitting device according to claim 2, wherein the insulating stack comprises a plurality of insulating layers with different refractive indices alternately stacked, and a thickness of the insulating stack is greater than a thickness of the current blocking structure.

4. The light-emitting device according to claim 2, wherein a sidewall of the current blocking structure comprises a plurality of sub-sidewalls having different slopes.

5. The light-emitting device according to claim 1, wherein an acute angle is formed between an upper surface of the second contact part and a sidewall of the insulating stack at the opening, and the acute angle is between 30 degrees and 80 degrees.

6. The light-emitting device according to claim 1, wherein the first electrode pad comprises a protruding portion covering the first contact part.

7. The light-emitting device according to claim 6, wherein the protruding portion completely covers the first contact part and is at least 1 μm beyond an edge of the first contact part.

8. The light-emitting device according to claim 1, wherein the platform area comprises a curved surface.

9. The light-emitting device according to claim 1, further comprising a transparent conductive layer formed on the second semiconductor layer;

wherein the first semiconductor layer comprises an upper surface not covered by the active region and the second semiconductor layer;

wherein the semiconductor stack comprises a continuous sidewall extending from the second semiconductor layer to a bottom of the first semiconductor layer in a cross-sectional view;

wherein a gap between an edge of the transparent conductive layer and an edge of the second semiconductor layer near the upper surface of the first semiconductor layer is smaller than a gap between the edge of the transparent conductive layer and the edge of the second semiconductor layer near the continuous sidewall in a top view.

10. The light-emitting device according to claim 1, further comprising a current blocking structure disposed under the plurality of conductive structures;

wherein the current blocking structure comprises two edges respectively aligned with the two opposite sides of the light emitting device.

11. The light-emitting device according to claim 10, further comprising a trench between any two of the first unit, the second unit, and the third unit, and wherein a bottom of the trench comprises an upper surface of the substrate;

wherein the current blocking structure covers the bottom and a length of the current blocking structure is substantially the same as a length of the trench.

12. A light-emitting module, comprising:

a carrier;

a plurality of bonding pads on the carrier;

a conductive bonding layer; and the light-emitting device according to claim 1;

wherein the first electrode pad and the second electrode pad are connected to the plurality of bonding pads by the conductive bonding layer.

13. A display device, comprising a plurality of pixels, wherein one of the plurality of pixels comprises the light-emitting device according to claim 1.

14. The light-emitting device according to claim 1, further comprising a reflective structure disposed on a surface of the substrate opposite to the semiconductor stack.

15. The light-emitting device according to claim 1, wherein one of the plurality of first finger parts is connected to the first contact part, and the first electrode pad is disposed without covering the one of the plurality of first finger parts.

16. The light-emitting device according to claim 1, wherein another one of the plurality of second finger parts is disposed on the second semiconductor layer of the first unit; and the first electrode pad is disposed without covering the another one of the plurality of second finger parts.

17. The light-emitting device according to claim 1, wherein the substrate comprises an upper surface on which the semiconductor stack is disposed, and a plurality of patterned structures;

wherein the upper surface of the substrate comprises a first area covered by the semiconductor stack and a second area not covered by the semiconductor stack; and wherein the plurality of patterned structures is disposed on the first area and is not disposed on the second area.

* * * * *